(12) United States Patent
Soma et al.

(10) Patent No.: US 8,377,808 B2
(45) Date of Patent: Feb. 19, 2013

(54) SEMICONDUCTOR DEVICE AND METHOD OF MANUFACTURING THE SAME

(75) Inventors: Mitsuru Soma, Saitama (JP); Hirotsugu Hata, Gunma (JP); Yoshimasa Amatatsu, Gunma (JP)

(73) Assignees: Sanyo Electric Co., Ltd., Osaka (JP); Sanyo Semiconductor Co., Ltd., Gunma (JP)

( * ) Notice: Subject to any disclaimer, the term of this patent is extended or adjusted under 35 U.S.C. 154(b) by 0 days.

(21) Appl. No.: 13/050,345

(22) Filed: Mar. 17, 2011

(65) Prior Publication Data

US 2011/0165765 A1 Jul. 7, 2011

Related U.S. Application Data

(62) Division of application No. 11/961,516, filed on Dec. 20, 2007, now Pat. No. 7,932,580.

(30) Foreign Application Priority Data

Dec. 21, 2006 (JP) .................................. 2006-344759
Nov. 30, 2007 (JP) .................................. 2007-311597

(51) Int. Cl.
*H01L 21/425* (2006.01)
(52) U.S. Cl. .................................. 438/526; 257/E21.334
(58) Field of Classification Search .................. 438/526; 257/E21.334
See application file for complete search history.

(56) References Cited

U.S. PATENT DOCUMENTS

| 7,291,883 | B2 | 11/2007 | Kanda et al. |
| 2005/0077571 | A1 | 4/2005 | Kanda et al. |
| 2006/0186507 | A1 | 8/2006 | Kanda et al. |
| 2006/0220115 | A1 | 10/2006 | Otake |
| 2007/0063274 | A1 | 3/2007 | Kanda et al. |
| 2007/0123006 | A1 | 5/2007 | Mita et al. |
| 2007/0145530 | A1 | 6/2007 | Soma et al. |
| 2007/0158754 | A1 | 7/2007 | Soma et al. |
| 2007/0245520 | A1 | 10/2007 | Yeh |
| 2007/0246738 | A1 | 10/2007 | Otake |
| 2007/0246739 | A1 | 10/2007 | Otake |
| 2007/0272942 | A1 | 11/2007 | Otake |
| 2008/0023796 | A1 | 1/2008 | Mita et al. |

FOREIGN PATENT DOCUMENTS

| JP | 3-16256 | 1/1991 |
| JP | 6-151577 | 5/1994 |
| JP | 09-283646 | 10/1997 |
| JP | 11-74366 | 3/1999 |

*Primary Examiner* — David S Blum
(74) *Attorney, Agent, or Firm* — Fish & Richardson P.C.

(57) ABSTRACT

In the substrate and the epitaxial layer, isolation regions are formed to divide the substrate and the epitaxial layer into a plurality of element formation regions. Each of the isolation regions is formed by connecting first and second P type buried diffusion layers with a P type diffusion layer. By disposing the second P type buried diffusion layer between the first P type buried diffusion layer and the P type diffusion layer, a lateral diffusion width of the first P type buried diffusion layer is reduced. This structure allows a formation region of the isolation region to be reduced in size.

5 Claims, 16 Drawing Sheets

(A)

(B)

SEMICONDUCTOR DEVICE AND METHOD OF MANUFACTURING THE SAME

This application claims priority from Japanese Patent Application Number JP2006-344759 filed on Dec. 21, 2006, and JP2007-311597 filed on Nov. 30, 2007, the contents of which are incorporated herein by reference in their entirety, and this application is a divisional of U.S. application 11,961, 516, now U.S. Pat. No. 7,932,580, filed Dec. 20, 2007.

BACKGROUND OF THE INVENTION

1. Field of the Invention

The present invention relates to a semiconductor device which achieves reduction in size of a formation region of an isolation region and in size of the device while maintaining breakdown voltage characteristics, and also relates to a manufacturing method thereof.

2. Description of the Related Art

As an embodiment of a conventional semiconductor device, a structure of the following NPN transistor 141 has been known. As shown in FIG. 15, an N type epitaxial layer 143 is formed on a P type semiconductor substrate 142. In the epitaxial layer 143, P type buried diffusion layers 144 and 145, which are diffused in a vertical direction (a depth direction) from a surface of the substrate 142, and P type diffusion layers 146 and 147, which are diffused from a surface of the epitaxial layer 143, are formed. Moreover, the epitaxial layer 143 is divided into a plurality of element formation regions by isolation regions 148 and 149 which are formed by connecting the P type buried diffusion layers 144 and 145 with the P type diffusion layers 146 and 147, respectively. In one of the element formation regions, for example, the NPN transistor 141 is formed. The NPN transistor 141 is mainly formed of an N type buried diffusion layer 150 used as a collector region, a P type diffusion layer 151 used as a base region and an N type diffusion layer 152 used as an emitter region. Moreover, the P type buried diffusion layers 144 and 145, which respectively form the isolation regions 148 and 149, are diffused by placing the substrate 142, for example, in a nitrogen atmosphere at 1050° C. for approximately 1 hour and subjecting the substrate to a dedicated heat treatment. Meanwhile, the P type diffusion layers 146 and 147, which respectively form the isolation regions 148 and 149, are diffused by placing the substrate 142, for example, in a nitrogen atmosphere at 1000° C. for approximately 2 hours and subjecting the substrate to a dedicated heat treatment. By these thermal diffusion steps, the P type buried diffusion layer 144 and the P type diffusion layer 146 are connected with each other to form the isolation region 148, and the P type buried diffusion layer 145 and the P type diffusion layer 147 are connected with each other to form the isolation region 149. This technique is described for instance in Japanese Patent Application Publication No. Hei 9 (1997)-283646 (Pages 3, 4 and 6, FIGS. 1 and 5 to 7).

As described above, in the conventional semiconductor device, the thickness of the epitaxial layer 143 is determined by taking account of the breakdown voltage of the NPN transistor 141 and the like. For example, in the case where a power semiconductor element and a control semiconductor element are monolithically formed on the same semiconductor substrate 142, the thickness of the epitaxial layer 143 is determined according to breakdown voltage characteristics of the power semiconductor element. Moreover, the P type buried diffusion layers 144 and 145, which respectively form the isolation regions 148 and 149, expand upward from the surface of the substrate 142 into the epitaxial layer 143. Meanwhile, the P type diffusion layers 146 and 147, which respectively form the isolation regions 148 and 149, expand downward from the surface of the epitaxial layer 143. This structure allows lateral diffusion widths W15 and W16 of the P type buried diffusion layers 144 and 145 to be increased with the increase of the upward expansion widths thereof. Accordingly, this structure has a problem that it is difficult to reduce in size of formation regions of the isolation regions 148 and 149.

Moreover, in the conventional semiconductor device, the epitaxial layer 143 is formed on the semiconductor substrate 142. The NPN transistor 141 is formed in a region defined by the isolation regions 148 and 149 in the epitaxial layer. Moreover, the epitaxial layer 143 is a region with a low concentration of the N type impurity. This structure allows a formation region of the P type buried diffusion layer 144 or a P type diffusion layer 151 to be shifted, and thereby allows a distance L5 between the both diffusion layers 144 and 151 to be shorten. Thus, a region in which a depletion layer expands is reduced in size. Accordingly, in the NPN transistor 141, short-circuiting is likely to occur between the base region and the isolation region. Thus, there is a problem that it is difficult to obtain desired breakdown voltage characteristics. Moreover, there is a problem that a variation in the distance L5 makes unstable the breakdown voltage characteristics of the NPN transistor 141.

Moreover, in the conventional semiconductor device, in order to achieve a desired breakdown voltage of the NPN transistor 141, it is required that the distance L5 between the P type diffusion layer 151 and the P type buried diffusion layer 144 in the isolation region 148 be a certain distance or more. Similarly, a distance L6 between the P type diffusion layer 151 and the P type diffusion layer 146 in the isolation region 148 is required to be a certain distance or more. However, there is a problem that the increase in the lateral diffusion widths W15 and W17 of the P type buried diffusion layer 144 and the P type diffusion layer 146, which form the isolation region 148, makes it difficult to reduce a device size of the NPN transistor 141.

Moreover, in a conventional method for manufacturing the semiconductor device, the two thermal diffusion steps described above are performed to connect the P type buried diffusion layers 144 and 145 with the P type diffusion layers 146 and 147 to form the isolation regions 148 and 149, respectively. This manufacturing method allows lateral diffusion widths W15 and W16 of the P type buried diffusion layers 144 and 145 to be increased with the increase of the corresponding upward expansion widths thereof. Moreover, by the thermal diffusion steps, the N type buried diffusion layer 150 also expands toward the surface of the epitaxial layer 143. As a result, a problem arises that it is difficult to reduce the thickness of the epitaxial layer 143, to reduce in size the formation regions of the isolation regions 148 and 149, and also to reduce the device size of the NPN transistor 141.

Furthermore, description will be given of a structure in which, as shown in FIG. 16, NPN transistors 161 and 162 are adjacent to each other with an isolation region 163 interposed therebetween. A ground voltage (GND) is applied to a collector region of the NPN transistor 161, and a power supply voltage (Vcc) is applied to a collector region of the NPN transistor 162. In this case, in the NPN transistor 162, a reverse bias is applied to a PN junction region of the P type isolation region 163 and a P type semiconductor substrate 164 with an N type epitaxial layer 165 and an N type buried diffusion layer 166. Moreover, depletion layers spread from the PN junction regions toward the P type isolation region 163 and the P type semiconductor substrate 164.

In this event, when an impurity concentration in an overlapping region between a P type buried diffusion layer 167 and a P type diffusion layer 168 is lowered in the isolation region 163, a depletion layer spreads into the NPN transistor 161 as indicated by a dotted line. Moreover, when spreading of the depletion layer reaches an N type buried diffusion layer 169, a problem arises that the collector regions of the NPN transistors 161 and 162 are short-circuited to cause a leak current. Meanwhile, in order to prevent the leak current, it is required to more widely diffuse the P type buried diffusion layer 167 and the P type diffusion layer 168, and thereby to increase the impurity concentration in the overlapping region. However, in this case, a diffusion width W18 of the P type buried diffusion layer 167 and a diffusion width W19 of the P type diffusion layer 168 are increased. Thus, there is a problem that it is difficult to reduce a device size of each of the NPN transistors 161 and 162.

SUMMARY OF THE INVENTION

The present invention was made in consideration of the foregoing circumstances. A semiconductor device of the present invention includes a one-conductivity type semiconductor substrate, an opposite-conductivity type epitaxial layer formed on the semiconductor substrate, and one-conductivity type isolation region which divides the epitaxial layer into a plurality of element formation regions. The isolation region is formed by connecting a first one-conductivity type buried diffusion layer formed across the semiconductor substrate and the epitaxial layer, a second one-conductivity type buried diffusion layer formed in the epitaxial layer and a first one-conductivity type diffusion layer formed in the epitaxial layer with each other. Accordingly, lateral diffusion widths of the first and second one-conductivity type buried diffusion layers and the first one-conductivity type diffusion layer are reduced. Thus, formation region of the isolation region is reduced in size.

A method for manufacturing a semiconductor device according to the present invention includes providing a one-conductivity type semiconductor substrate, forming an opposite-conductivity type epitaxial layer on the semiconductor substrate after implanting ions of an impurity for forming a first one-conductivity type buried diffusion layer into the semiconductor substrate, and forming an isolation region by firstly implanting ions of an impurity for forming a second one-conductivity type buried diffusion layer from a surface of the epitaxial layer, then continuously implanting ions of an impurity for forming a one-conductivity type diffusion layer, and finally performing thermal diffusion, so as to connect the first one-conductivity type buried diffusion layer, the second one-conductivity type buried diffusion layer and the one-conductivity type diffusion layer with each other. Accordingly, in the present invention, dedicated thermal diffusion steps for diffusing the second one-conductivity type buried diffusion layer after implanting ions of the impurity for forming the second one-conductivity type buried diffusion layer, which forms the isolation region, is omitted. By use of this manufacturing method, lateral diffusion of the first one-conductivity type buried diffusion layer is reduced and a formation region of the isolation region is reduced in size.

DESCRIPTION OF THE EMBODIMENTS

Figure 1:
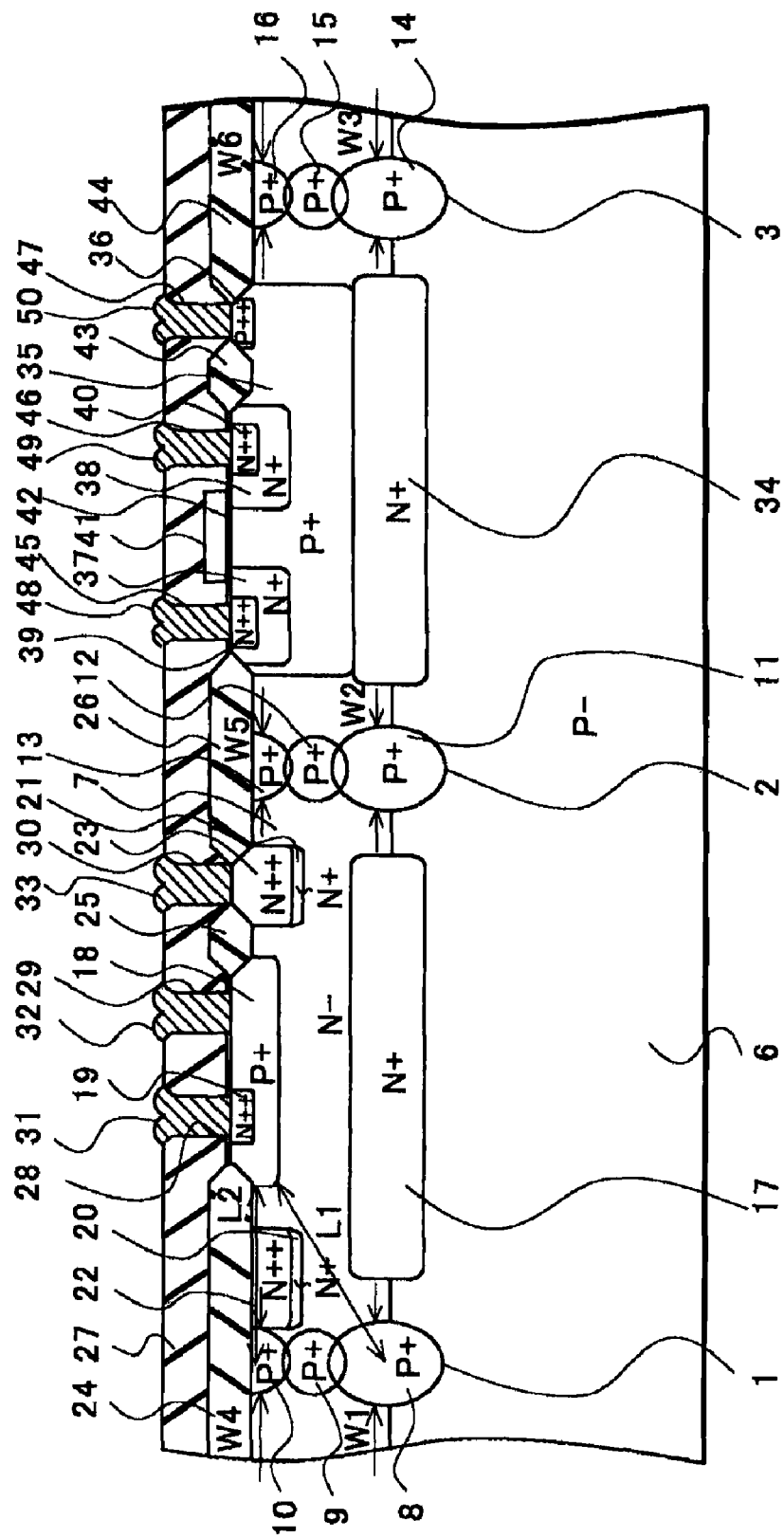
FIG. 1 is a cross-sectional view showing a semiconductor device according to a preferred embodiment of the present invention.

With reference to FIG. 1, a semiconductor device according to an embodiment of the present invention will be described in detail below. FIG. 1 is a cross-sectional view showing the semiconductor device according to this embodiment.

As shown in FIG. 1, an NPN transistor 4 is formed in one of element formation regions partitioned with isolation regions 1 to 3 and an N channel type metal oxide semiconductor (MOS) transistor 5 is formed in another element formation region. Note that, although not shown in FIG. 1, a P channel MOS transistor, a PNP transistor and the like are formed in the other element formation regions.

First, as shown in FIG. 1, a P type single crystal silicon substrate 6 and an N type epitaxial layer 7 are divided into a plurality of element formation regions by the isolation regions 1 to 3. The isolation region 1 is formed of P type buried diffusion layers 8 and 9 and a P type diffusion layer 10. Similarly, the isolation region 2 is formed of P type buried diffusion layers 11 and 12 and a P type diffusion layer 13, and the isolation region 3 is formed of P type buried diffusion layers 14 and 15 and a P type diffusion layer 16. Note that, although the isolation regions 1 to 3 are individually shown in the cross-section of FIG. 1, the isolation regions 1 to 3 are integrally formed so as to surround the element formation regions.

The N type epitaxial layer 7 is formed on the P type single crystal silicon substrate 6.

The P type buried diffusion layers 8, 11 and 14 are formed across the P type single crystal silicon substrate 6 and the epitaxial layer 7. Note that, although described in detail later in description of a method for manufacturing a semiconductor device, the P type buried diffusion layers 8, 11 and 14 are formed by thermally diffusing a P type impurity implanted into the substrate 6 by using ion implantation.

The P type buried diffusion layers 9, 12 and 15 are formed only in the epitaxial layer 7. The P type buried diffusion layers 9, 12 and 15 are connected with the P type buried diffusion layers 8, 11 and 14. Note that, although described in detail later in description of the method for manufacturing a semiconductor device, the P type buried diffusion layers 9, 12 and 15 are formed by thermally diffusing a P type impurity implanted from a surface of the epitaxial layer 7 by using ion implantation.

The P type diffusion layers 10, 13 and 16 are formed in the epitaxial layer 7. The P type diffusion layers 10, 13 and 16 are connected with the P type buried diffusion layers 9, 12 and 15. Note that, although described in detail later in description of the method for manufacturing a semiconductor device, the P type diffusion layers 10, 13 and 16 are formed by thermally diffusing a P type impurity implanted into the epitaxial layer 7 by using implantation.

As shown in FIG. 1, in the isolation region 1, the P type buried diffusion layer 9 is disposed between the P type buried diffusion layer 8 and the P type diffusion layer 10. Moreover, the P type buried diffusion layer 9 is connected with the P type buried diffusion layer 8, which expands upward from a surface of the substrate 6, and the P type diffusion layer 10, which expands downward from the surface of the epitaxial layer 7. This structure implements reduction in an upward expansion width of the P type buried diffusion layer 8 in a surface direction (a depth direction) and also significant reduction in a lateral diffusion width W1 of the P type buried diffusion layer 8. Since a formation region of the isolation region 1 is determined according to the lateral diffusion width W1 of the P type buried diffusion layer 8, thus, the formation region of the isolation region 1 is significantly reduced in size. Similarly, also in the isolation regions 2 and 3, diffusion widths W2 and W3 of the respective P type buried diffusion layers 11 and 14 are significantly reduced. Thus, formation regions of the isolation regions 2 and 3 are also significantly reduced in size. Moreover, in the isolation regions 1 to 3, downward expansion widths of the P type diffusion layers 10, 13 and 16 are reduced by the P type buried diffusion layers 9, 12 and 15. Accordingly, lateral diffusion widths W4, W5 and W6 of the respective P type diffusion layers 10, 13 and 16 are reduced.

The NPN transistor 4 is mainly formed of the P type single crystal silicon substrate 6, the N type epitaxial layer 7, an N type buried diffusion layer 17 used as a collector region, a P type diffusion layer 18 used as a base region, an N type diffusion layer 19 used as an emitter region, and N type diffusion layers 20 to 23.

The N type buried diffusion layer 17 is formed across the substrate 6 and the epitaxial layer 7.

The N type diffusion layers 20 and 21 are formed in the epitaxial layer 7. The N type diffusion layer 22 is formed so as to overlap with the N type diffusion layer 20. The N type diffusion layer 23 is formed so as to overlap with the N type diffusion layer 21. Moreover, the N type diffusion layer 20 is disposed between the P type diffusion layer 18 used as the base region and the isolation regions 1, and the N type diffusion layer 21 is disposed between the P type diffusion layer 18 and the isolation region 2. Although not shown in FIG. 1, for example, the N type diffusion layers 20 and 21 are circularly arranged so as to surround the P type diffusion layer 18.

LOCOS oxide films 24, 25 and 26 are formed in the epitaxial layer 7. Each of the LOCOS oxide films 24, 25 and 26 has a thickness of, for example, approximately 3000 to 10000 Å in its flat portion. Below the LOCOS oxide films 24 and 26, the P type isolation regions 1 and 2 are formed, respectively.

An insulating layer 27 is formed on an upper surface of the epitaxial layer 7. The insulating layer 27 is formed of a non-doped silicate glass (NSG) film, a boron phospho silicate glass (BPSG) film or the like. By use of a heretofore known photolithography technique, contact holes 28, 29 and 30 are formed in the insulating layer 27 by dry etching using, for example, $CHF_3$ or $CF_4$ gas.

In the contact holes 28, 29 and 30, aluminum alloy films made of, for example, an Al—Si film, an Al—Si—Cu film, an Al—Cu film or the like are selectively formed. Thus, an emitter electrode 31, a base electrode 32 and a collector electrode 33 are formed. In this event, the collector electrode 33 is connected to the N type diffusion layer 23 through the contact hole 30. By utilizing the N type diffusion layers 21 and 23, a sheet resistance value in the collector region is reduced. Note that the emitter electrode 31, the base electrode 32 and the collector electrode 33 may be formed by burying metal plugs such as tungsten (W) in the contact holes 28, 29 and 30 and forming aluminum alloy films thereon.

Meanwhile, the N channel MOS transistor 5 is mainly formed of the P type single crystal silicon substrate 6, the N type epitaxial layer 7, an N type buried diffusion layer 34, P type diffusion layers 35 and 36 used as a back gate region, N type diffusion layers 37 and 39 used as a source region, N type diffusion layers 38 and 40 used as a drain region, and a gate electrode 41.

The N type buried diffusion layer 34 is formed across the substrate 6 and the epitaxial layer 7.

The P type diffusion layer 35 is formed in the epitaxial layer 7 and is used as the back gate region. The P type diffusion layer 36 is formed so as to overlap with the P type diffusion layer 35 and is used as a back gate lead-out region.

The N type diffusion layers 37 and 38 are formed in the P type diffusion layer 35. The N type diffusion layer 37 is used as the source region. The N type diffusion layer 38 is used as the drain region. The N type diffusion layer 39 is formed in the N type diffusion layer 37, and the N type diffusion layer 40 is formed in the N type diffusion layer 38. By use of this structure, the drain region is formed to have a double diffused drain (DDD) structure. Moreover, the P type diffusion layer 35 positioned between the N type diffusion layers 37 and 38 is used as a channel region. On the upper surface of the epitaxial layer 7 above the channel region, a gate oxide film 42 is formed.

The gate electrode 41 is formed on an upper surface of the gate oxide film 42. The gate electrode 41 is formed of, for example, a polysilicon film and a tungsten silicide film so as to have a desired thickness. Although not shown in FIG. 1, a silicon oxide film is formed on an upper surface of the tungsten silicide film.

The LOCOS oxide films 26, 43 and 44 are formed in the epitaxial layer 7.

The insulating layer 27 is formed on the upper surface of the epitaxial layer 7. By use of the heretofore known photolithography technique, contact holes 45, 46 and 47 are formed in the insulating layer 27 by dry etching using, for example, a $CHF_3$ or $CF_4$ gas.

In the contact holes 45, 46 and 47, aluminum alloy films made of, for example, an Al—Si film, an Al—Si—Cu film, an Al—Cu film or the like are selectively formed. Thus, a source electrode 48, a drain electrode 49 and a back gate electrode 50 are formed. Note that the source electrode 48, the drain electrode 49 and the back gate electrode 50 may be formed by burying metal plugs such as tungsten (W) in the contact holes 45, 46 and 47 and forming aluminum alloy films thereon.

Figure 15:
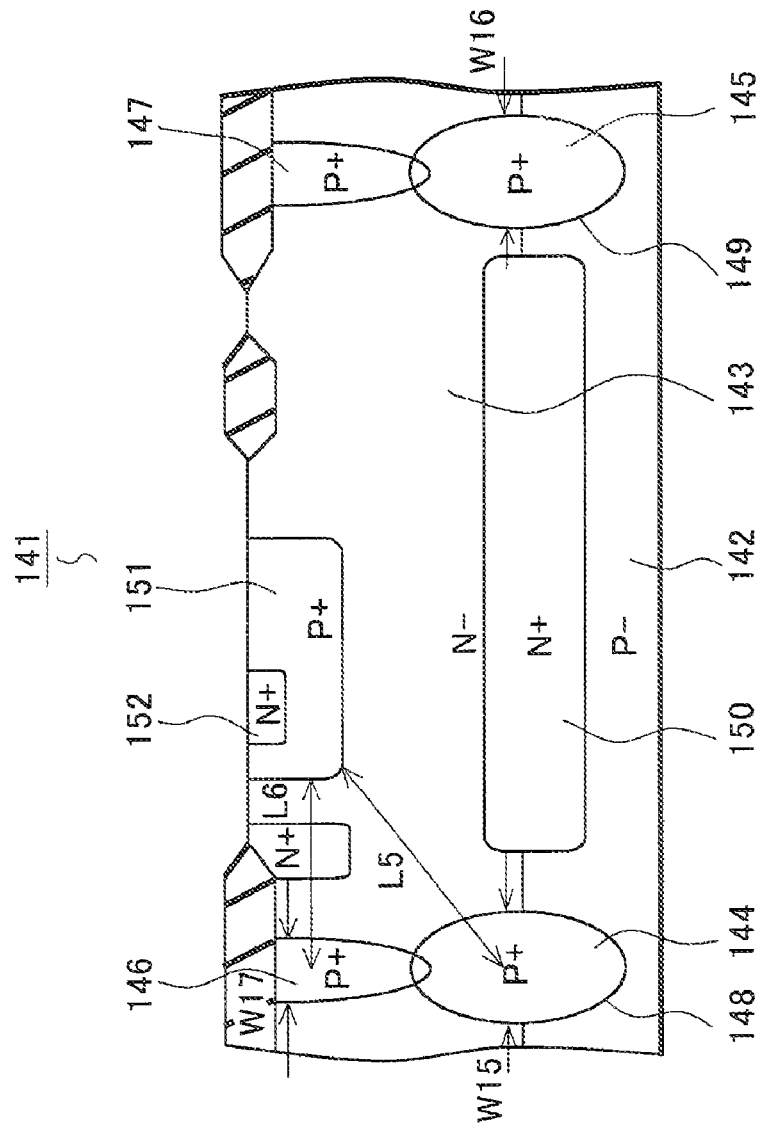
FIG. 15 is a cross-sectional view showing a semiconductor device according to a conventional embodiment.
Figure 16:
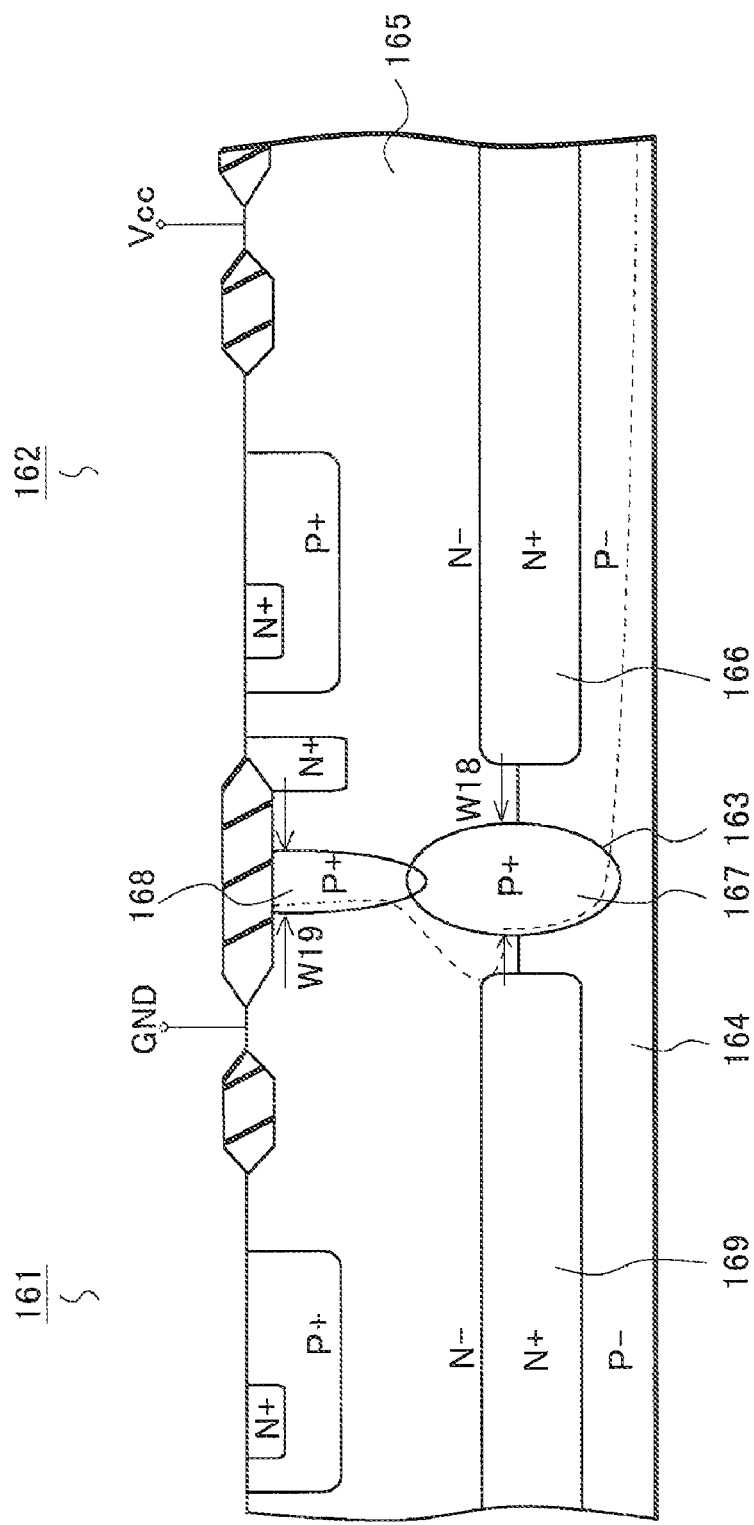
FIG. 16 is a cross-sectional view showing a semiconductor device according to a conventional embodiment.

Although described in detail later in description of the method for manufacturing a semiconductor device, special thermal diffusion steps for diffusing the P type buried diffusion layers 8, 9, 11, 12, 14 and 15 and the P type diffusion layers 10, 13 and 16, respectively, are omitted. Particularly, by omitting the dedicated thermal diffusion step for diffusing the P type buried diffusion layers 8, 11 and 14, upward expansion widths of the N type buried diffusion layers 17 and 34 are reduced. Thus, the thickness of the epitaxial layer 7 can be reduced. To be more specific, while maintaining breakdown voltage characteristics of the NPN transistor 4 and the like, the epitaxial layer 143 (see FIG. 15) has a thickness of, for example, 2.1 μm in the conventional structure. Meanwhile, in this embodiment, the epitaxial layer 7 has a thickness of, for example, 1.6 μm. Specifically, by reducing the thickness of the epitaxial layer 7 and also the lateral diffusion width W1 of the P type buried diffusion layer 8, a distance L1 between the P type diffusion layer 18 and the P type buried diffusion layer 8 can be shortened. Moreover, as described above, by reducing the lateral diffusion width W4 of the P type diffusion layer 10, a distance L2 between the P type diffusion layer 18 and the P type diffusion layer 10 can be shortened. In the conventional structure, the distance L5 (see FIG. 15) between the P type diffusion layer 151 (see FIG. 15) and the P type buried diffusion layer 144 (see FIG. 15) is, for example, 1.7 μm, and the distance L6 (see FIG. 15) between the P type diffusion layer 151 and the P type diffusion layer 146 (see FIG. 15) is, for example, 2.0 μm. Meanwhile, in this embodiment, the distance L1 is caused to be, for example, 0.8 μm and the distance L2 is caused to be, for example, 1.0 μm. As a result, a distance between the base region and the isolation region is shortened while maintaining the breakdown voltage characteristics of the NPN transistor 4. Thus, a device size of the NPN transistor 4 is reduced.

Furthermore, as described above, the N type diffusion layers 20 and 21 are disposed between the P type diffusion layer 18 used as the base region and the P type isolation region 1, and the N type diffusion layers 21 and 23 are disposed between the P type diffusion layer 18 used as the base region and the P type isolation region 2. By providing the N type diffusion layers 20 to 23, an impurity concentration is increased in the epitaxial layer 7 in the region between the P type diffusion layer 18 and the P type isolation region 1, and the region between the P type diffusion layer 18 and the P type isolation region 2. In this structure, spreading of a depletion layer which spreads toward the N type epitaxial layer 7 from a PN junction region between the P type diffusion layer 18 and the N type epitaxial layer 7 is suppressed by the N type diffusion layers 20 to 23. Similarly, spreading of both a depletion layer which spreads from PN junction region between the N type epitaxial layer 7 and the P type isolation region 1, and a depletion layer which spreads from PN junction region between the N type epitaxial layer 7 and the P type isolation region 2 are also suppressed by the N type diffusion layers 20 to 23. Accordingly, spreading of the depletion layers described above is controlled by the N type diffusion layers 20 to 23 to make short-circuiting less likely to occur between the base region and the isolation regions. Thus, the breakdown voltage characteristics of the NPN transistor 4 are improved.

In this event, the N type diffusion layers 20 and 22 are formed so as to overlap with each other, and the N type diffusion layers 21 and 23 are formed so as to overlap with each other. Accordingly, high impurity concentration N type diffusion layers are formed while suppressing increases in the diffusion widths. This structure makes it possible to shorten the distances between the base region and the isolation regions while improving the breakdown voltage characteristics of the NPN transistor 4. Thus, the device size of the NPN transistor 4 is reduced.

Note that, in this embodiment, the description was given of the case where only the P type buried diffusion layers 9, 12 and 15 are disposed between the P type buried diffusion layers 8, 11 and 14 and the P type diffusion layers 10, 13 and 16 in the isolation regions 1 to 3, respectively. However, the preferred embodiment of the present invention is not limited to the above case. For example, multiple stages of P type buried diffusion layers may be disposed between the P type buried diffusion layers 8, 11 and 14 and the P type diffusion layers 10, 13 and 16, respectively.

Moreover, in this embodiment, various design changes in arrangement regions of the N type diffusion layers 20 to 23 can be made according to the breakdown voltage characteristics of the NPN transistor 4. For example, the N type diffusion layers 20 to 23 do not always have to be disposed in regions where desired breakdown voltage characteristics are secured by the distances between the P type diffusion layer 18 and the P type isolation regions 1 and 2. In other words, it is only necessary to dispose the N type diffusion layers 20 to 23 at least in regions where the distance between the P type diffusion layer 18 and the P type isolation region 1 or 2 is short.

Moreover, in this embodiment, the description was given of the case where the N type diffusion layers 20 and 22 are formed so as to overlap with each other and the N type diffusion layers 21 and 23 are formed so as to overlap with each other. However, the preferred embodiment of the present invention is not limited to the above case. For example, only the N type diffusion layers 20 and 21 may be provided. Moreover, a multiple diffusion structure such as a triple diffusion structure may be employed. Besides the above, various changes can be made without departing from the scope of the present invention.

Next, with reference to FIGS. 2 to 9, detailed description will be given of a method for manufacturing a semiconductor device according to a second embodiment of the present invention. FIGS. 2 to 9 are cross-sectional views showing the method for manufacturing a semiconductor device according to this embodiment.

Figure 2:
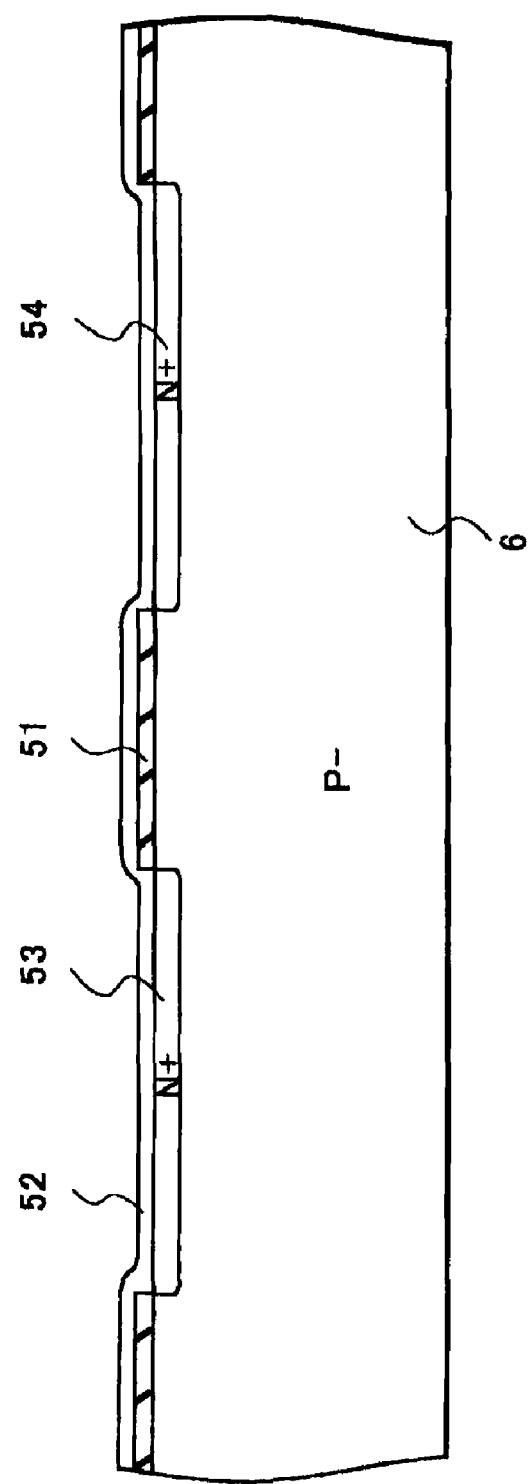
FIG. 2 is a cross-sectional view showing a method for manufacturing a semiconductor device according to a preferred embodiment of the present invention.

First, as shown in FIG. 2, a P type single crystal silicon substrate 6 is provided. A silicon oxide film 51 is formed on the substrate 6, and the silicon oxide film 51 is selectively removed so as to form openings on formation regions of N type buried diffusion layers 53 and 54. Thereafter, by using the silicon oxide film 51 as a mask, a liquid source 52 containing an N type impurity, for example, antimony (Sb) is applied onto a surface of the substrate 6 by use of a spin-coating method. Subsequently, after the antimony (Sb) is thermally diffused to form the N type buried diffusion layers 53 and 54, the silicon oxide film 51 and the liquid source 52 are removed.

Figure 3:
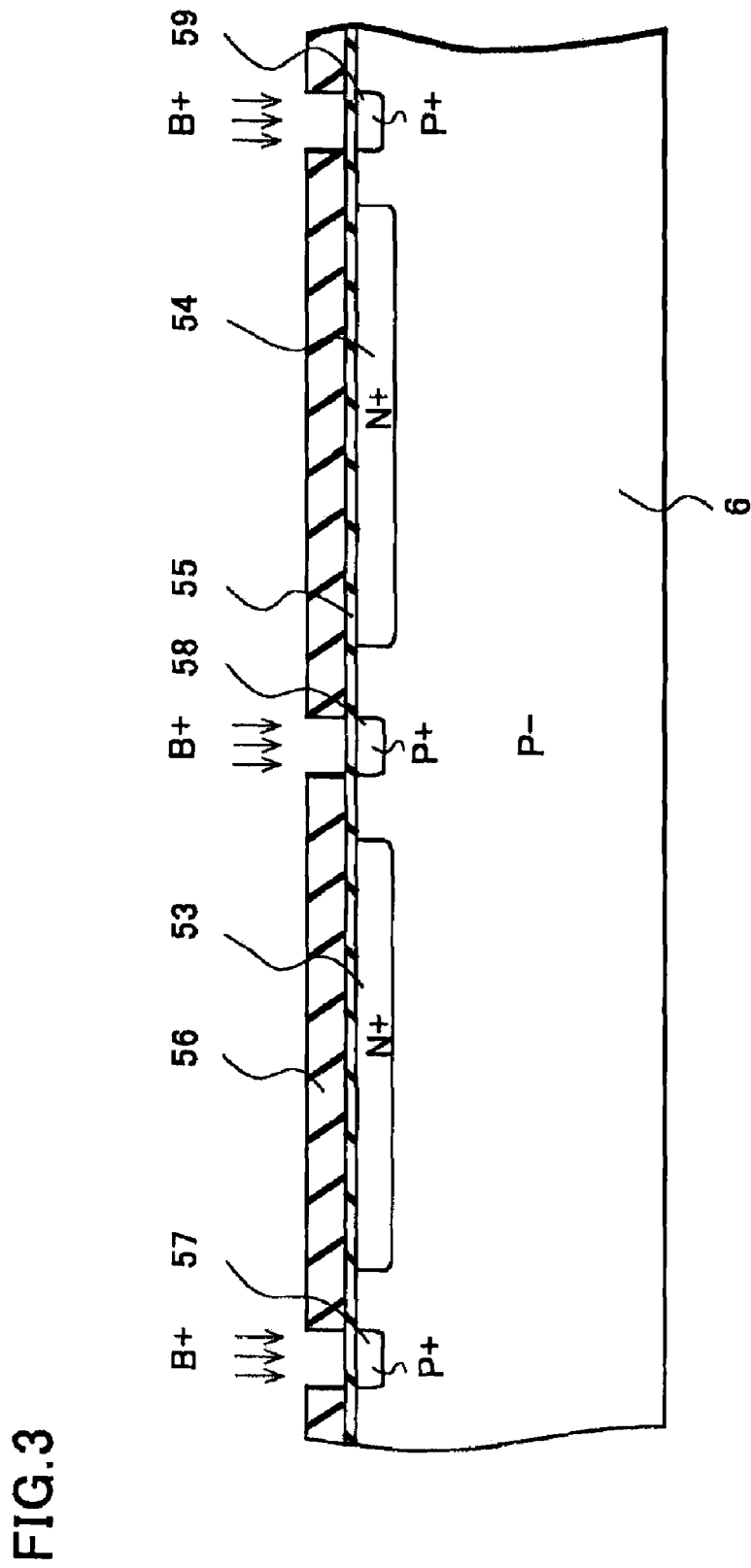
FIG. 3 is a cross-sectional view showing the method for manufacturing a semiconductor device according to the embodiment of the present invention.

Next, as shown in FIG. 3, a silicon oxide film 55 is formed on the substrate 6 and a photoresist 56 is formed on the silicon oxide film 55. Thereafter, by use of a heretofore known photolithography technique, openings are formed in the photoresist 56 on regions where P type buried diffusion layers 57 to 59 are to be formed. Subsequently, ions of a P type impurity, for example, boron (B+) are implanted from the surface of the substrate 6 at an accelerating voltage of 70 to 90 keV and a dose of $3.0 \times 10^{12}$ to $1.0 \times 10^{14}/cm^2$.

Figure 4:
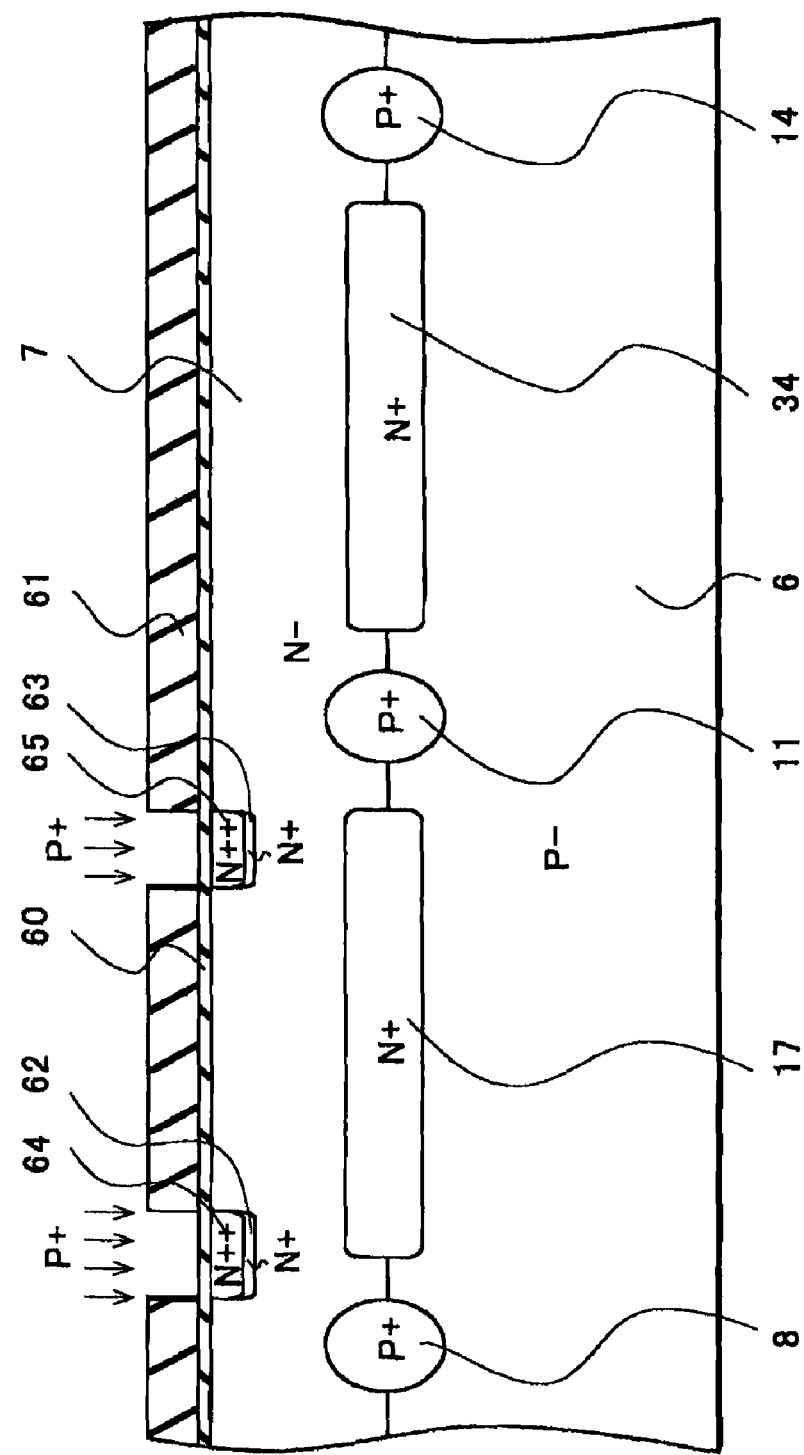
FIG. 4 is a cross-sectional view showing the method for manufacturing a semiconductor device according to the embodiment of the present invention.

Next, as shown in FIG. 4, the substrate 6 is placed on a susceptor of a vapor phase epitaxial growth apparatus, and an N type epitaxial layer 7 is formed on the substrate 6. In this event, the epitaxial layer 7 is formed so as to have a thickness of approximately 1.5 to 1.7 μm. By heat treatment in the step of forming the epitaxial layer 7, the N type buried diffusion layers 53 and 54 (see FIG. 3) and the P type buried diffusion layers 57 to 59 (see FIG. 3) are thermally diffused to form N type buried diffusion layers 17 and 34 and P type buried diffusion layers 8, 11 and 14.

Thereafter, without performing a dedicated thermal diffusion step for thermally diffusing the P type buried diffusion layers 8, 11 and 14, a silicon oxide film 60 is formed on the epitaxial layer 7 and a photoresist 61 is formed on the silicon oxide film 60. Subsequently, by use of the heretofore known photolithography technique, openings are formed in the photoresist 61 on regions where N type diffusion layers 62 to 65 are to be formed. First, in order to form the N type diffusion layers 62 and 63, ions of an N type impurity, for example, phosphorus (P+) are implanted from the surface of the epitaxial layer 7 at an accelerating voltage of 370 to 390 keV and a dose of $1.0 \times 10^{11}$ to $1.0 \times 10^{13}/cm^2$. Next, in order to form the N type diffusion layers 64 and 65, ions of an N type impurity, for example, phosphorus (P+) are continuously implanted from the surface of the epitaxial layer 7 at an accelerating voltage of 370 to 390 keV and a dose of $1.0 \times 10^{11}$ to $1.0 \times 10^{13}/cm^2$. After the photoresist 61 is removed and thermal diffusion is performed, the silicon oxide film 60 is removed. Note that the N type diffusion layers 62 to 65 are thermally diffused by the thermal diffusion step to form N type diffusion layers 20 to 23 (see FIG. 5).

Figure 5:
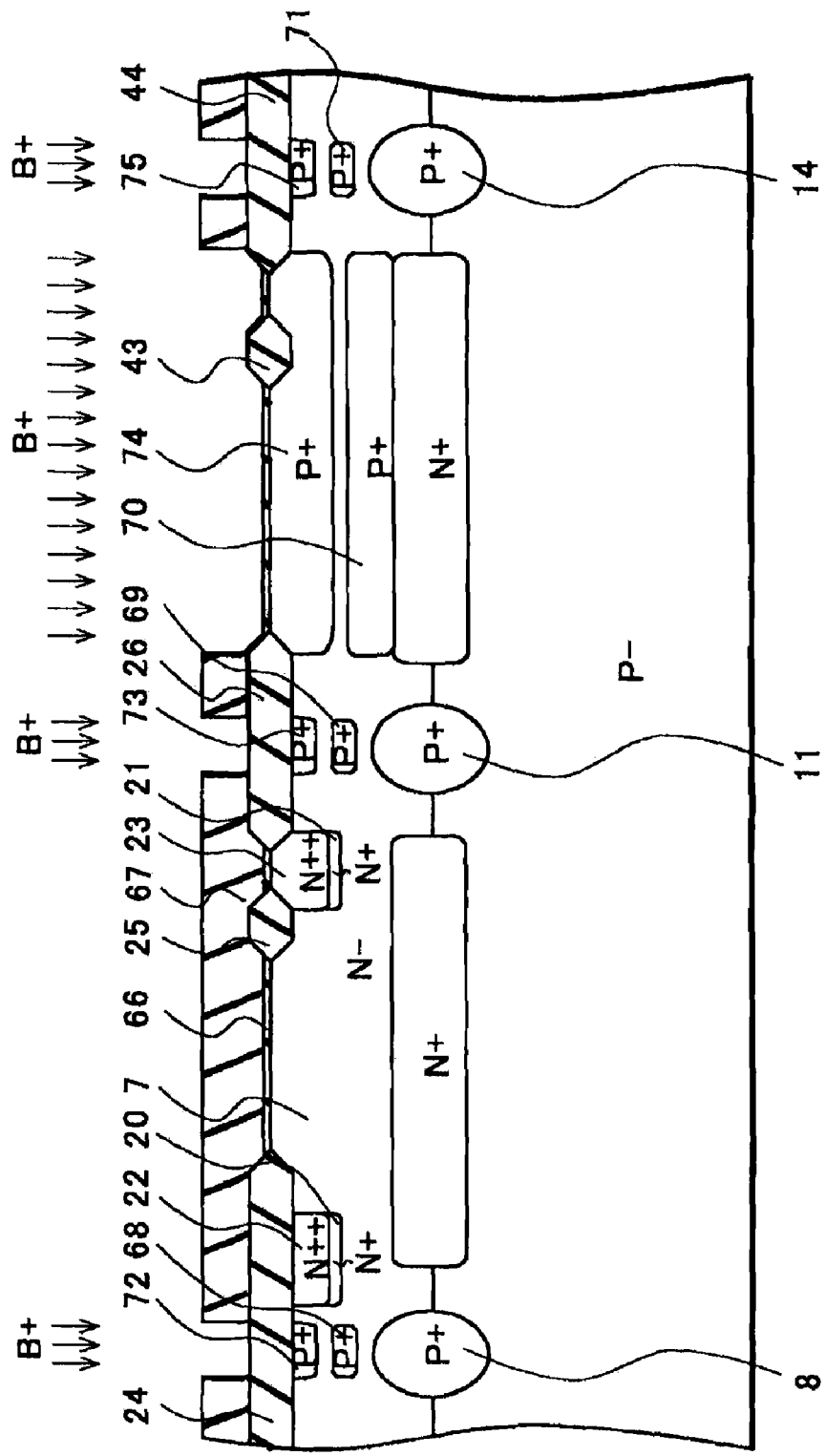
FIG. 5 is a cross-sectional view showing the method for manufacturing a semiconductor device according to the embodiment of the present invention.

Next, as shown in FIG. 5, LOCOS oxide films 24, 25, 26, 43 and 44 are formed in desired regions of the epitaxial layer 7. Thereafter, a silicon oxide film 66 is formed on the upper surface of the epitaxial layer 7 and a photoresist 67 is formed on the silicon oxide film 66. Subsequently, by use of the heretofore known photolithography technique, openings are formed in the photoresist 67 on regions where P type buried diffusion layers 68 to 71 are to be formed. Thereafter, ions of a P type impurity, for example, boron (B++) are implanted from the surface of the epitaxial layer 7 at an accelerating voltage of 290 to 310 keV and a dose of $2.5 \times 10^{12}$ to $1.0 \times 10^{14}/cm^2$.

Next, second ion implantation is performed by use of the same photoresist 67 without thermally diffusing the P type buried diffusion layers 68 to 71. Specifically, ions of a P type impurity, for example, boron (B+) are implanted from above the photoresist 67 at an accelerating voltage of 150 to 170 keV and a dose of $1.0 \times 10^{12}$ to $1.0 \times 10^{14}/cm^2$. By this second ion implantation step, P type diffusion layers 72 to 75 are formed. Thereafter, the photoresist 67 is removed. Thus, in this embodiment, dedicated thermal diffusion steps for thermally diffusing the P type buried diffusion layers 68 to 71 and the P type diffusion layers 72 to 75 are omitted.

Here, after the LOCOS oxide films 24, 26, 43 and 44 are formed, boron ions (B++, B+) are implanted from above the LOCOS oxide films 24, 26, 43 and 44. This manufacturing method makes it possible to prevent occurrence of crystal defects caused by heat in formation of the LOCOS oxide films 24, 26, 43 and 44 from the surface of the epitaxial layer 7 damaged by the implantation of boron ions (B++, B+) having a relatively large molecular size.

Figure 6:
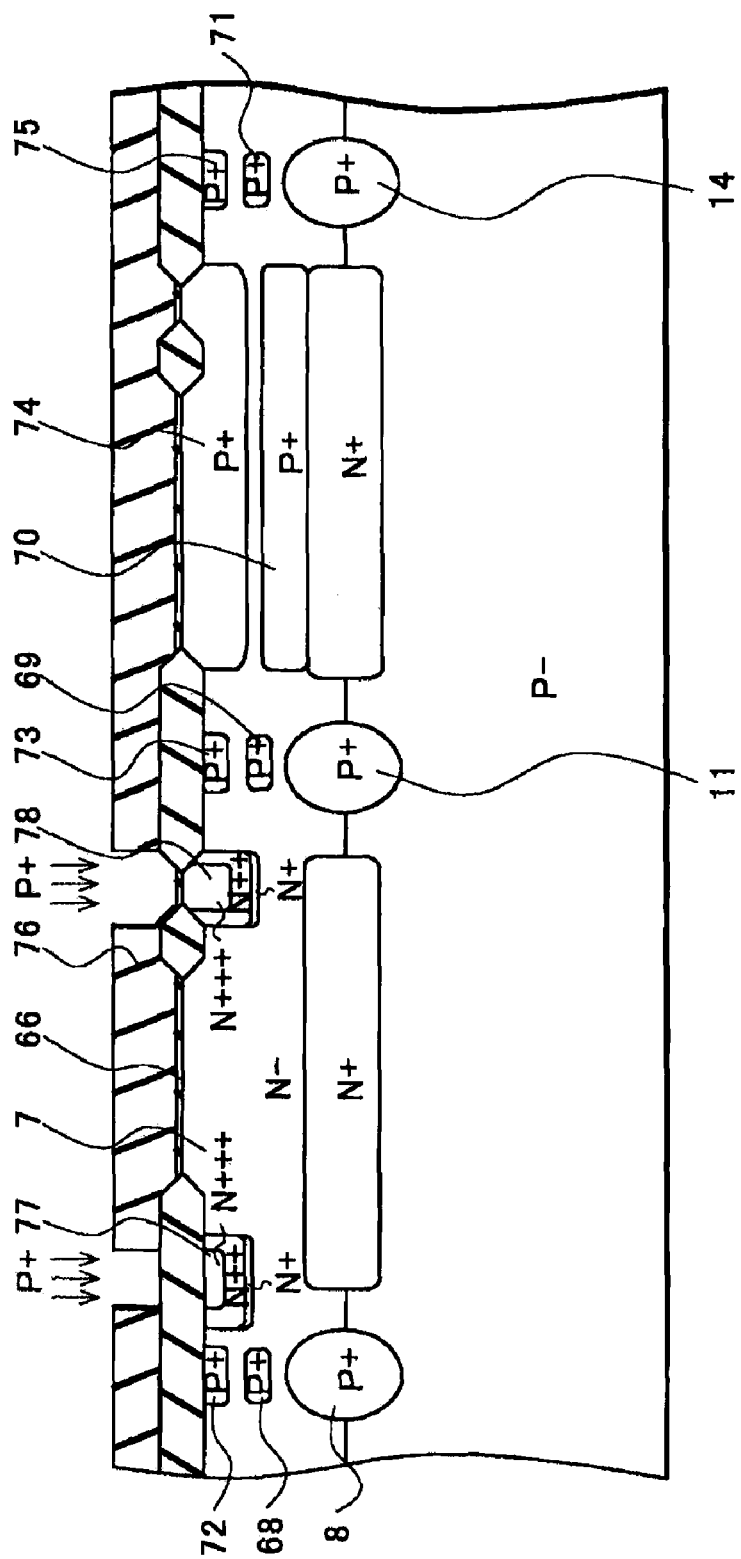
FIG. 6 is a cross-sectional view showing the method for manufacturing a semiconductor device according to the embodiment of the present invention.

Next, as shown in FIG. 6, a photoresist 76 is formed on the silicon oxide film 66. Thereafter, by use of the heretofore known photolithography technique, openings are formed in the photoresist 76 on regions where N type diffusion layers 77 and 78 are to be formed. Subsequently, ions of an N type impurity, for example, phosphorus (P+) are implanted from the surface of the epitaxial layer 7 at an accelerating voltage of 70 to 90 keV and a dose of $1.0 \times 10^{11}$ to $1.0 \times 10^{13}/cm^2$. After the photoresist 76 is removed and thermal diffusion is performed, the silicon oxide film 66 is removed.

Figure 7:
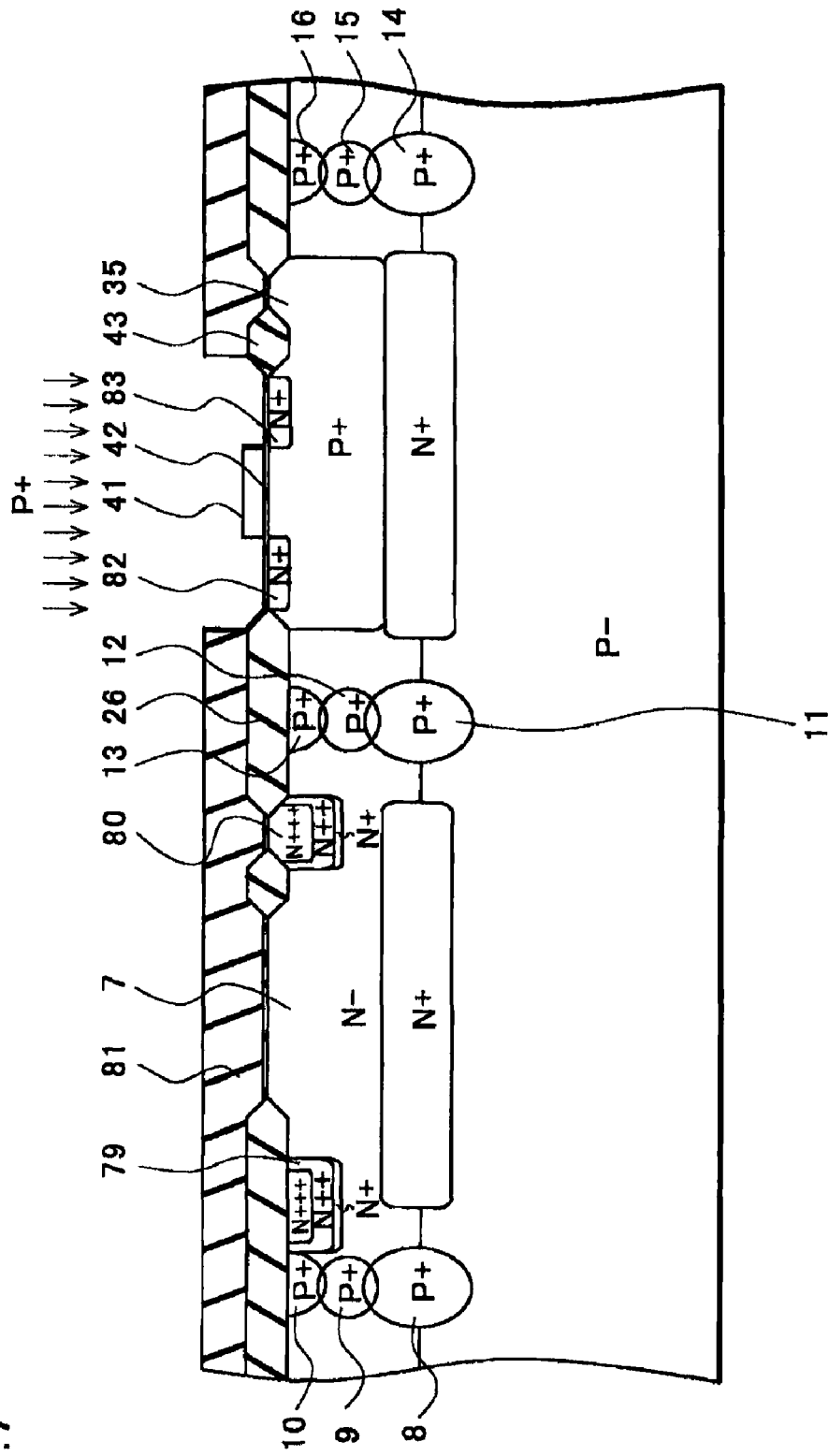
FIG. 7 is a cross-sectional view showing the method for manufacturing a semiconductor device according to the embodiment of the present invention.

Note that, by the thermal diffusion steps, the P type buried diffusion layers 68 to 71, the P type diffusion layers 72 to 75 and the N type diffusion layers 77 and 78 are thermally diffused to form P type buried diffusion layers 9, 12 and 15 (see FIG. 7), P type diffusion layers 10, 13, 16 and 35 (see FIG. 7) and N type diffusion layers 79 and 80 (see FIG. 7). In the following description, the diffusion layers described above will be described as the P type buried diffusion layers 9, 12 and 15, the P type diffusion layers 10, 13, 16 and 35 and the N type diffusion layers 79 and 80, respectively. Moreover, the P type buried diffusion layer 70 and the P type diffusion layer 74 are connected with each other by thermal diffusion to form the P type diffusion layer 35 (see FIG. 7). Thus, those diffusion layers will be described below as the P type diffusion layer 35. Furthermore, although not shown in FIG. 6, the N type diffusion layers 79 and 80 are formed in the same step as that of N type diffusion layers which form a back gate region in a P channel MOS transistor. However, the N type diffusion layers 79 and 80 may or may not be formed.

As described above with reference to FIGS. 5 and 6, the second ion implantation step is continuously performed after the first ion implantation step without performing the dedicated thermal diffusion step for thermally diffusing the P type buried diffusion layers 68 to 71. Furthermore, the ion implantation step for forming the N type diffusion layers 79 and 80 is performed without performing the dedicated thermal diffusion step for thermally diffusing the P type buried diffusion layers 72 to 75. Thereafter, the thermal diffusion step is performed. By use of this manufacturing method, the P type buried diffusion layers 9, 12 and 15, the P type diffusion layers 10, 13, 16 and 35 and the N type diffusion layers 79 and 80 are formed in one thermal diffusion step. Specifically, two thermal diffusion steps after the first and second ion implantation steps are omitted to control lateral diffusion widths W1, W2 and W3 (see FIG. 1) of the P type buried diffusion layers 8, 11 and 14. Thus, formation regions of isolation regions 1 to 3 (see FIG. 1) can also be reduced.

Furthermore, in the first ion implantation step, the ion implantation is performed at an accelerating voltage higher than that in the second ion implantation step. Moreover, the P type buried diffusion layers 9, 12 and 15 are formed near the P type buried diffusion layers 8, 11 and 14. This manufacturing method makes it possible to surely connect the P type buried diffusion layers 9, 12 and 15 with the P type buried diffusion layers 8, 11 and 14, respectively, while reducing upward expansion widths of the P type buried diffusion layers 8, 11 and 14.

Furthermore, the upward expansion widths of the P type buried diffusion layers 8, 11 and 14 can be reduced by forming the P type buried diffusion layers 9, 12 and 15 near the P type buried diffusion layers 8, 11 and 14, respectively. This manufacturing method makes it possible to set a low impurity concentration in each of the P type buried diffusion layers 8, 11 and 14 and also to reduce the formation regions of the isolation regions 1 to 3 by controlling the lateral diffusion widths W1, W2 and W3 of the P type buried diffusion layers 8, 11 and 14, respectively. Similarly, by reducing downward expansion widths of the P type diffusion layers 10, 13 and 16, lateral diffusion widths W4, W5 and W6 (see FIG. 1) of the P type diffusion layers 10, 13 and 16 can be controlled, respectively.

Next, as shown in FIG. 7, a silicon oxide film used as a gate oxide film 42 is formed on the epitaxial layer 7. Thereafter, a polysilicon film and a tungsten silicide film, for example, are sequentially formed on the gate oxide film 42 to form a gate electrode 41 by use of the heretofore known photolithography technique. Subsequently, a photoresist 81 is formed on the silicon oxide film used as the gate oxide film 42. Thereafter, by use of the heretofore known photolithography technique, openings are formed in the photoresist 81 on regions where N type diffusion layers 82 and 83 are to be formed. Subsequently, ions of an N type impurity, for example, phosphorus (P+) are implanted from the surface of the epitaxial layer 7 at an accelerating voltage of 70 to 90 keV and a dose of $1.0 \times 10^{11}$ to $1.0 \times 10^{13}/cm^2$. In this event, by utilizing the LOCOS oxide films 26 and 43 and the gate electrode 41 as a mask, the N type diffusion layers 82 and 83 can be formed with good positional accuracy. Thereafter, the photoresist 81 is removed and thermal diffusion is performed. Note that the N type diffusion layers 82 and 83 are thermally diffused by the thermal diffusion step to form N type diffusion layers 37 and 38, respectively (see FIG. 8).

Figure 8:
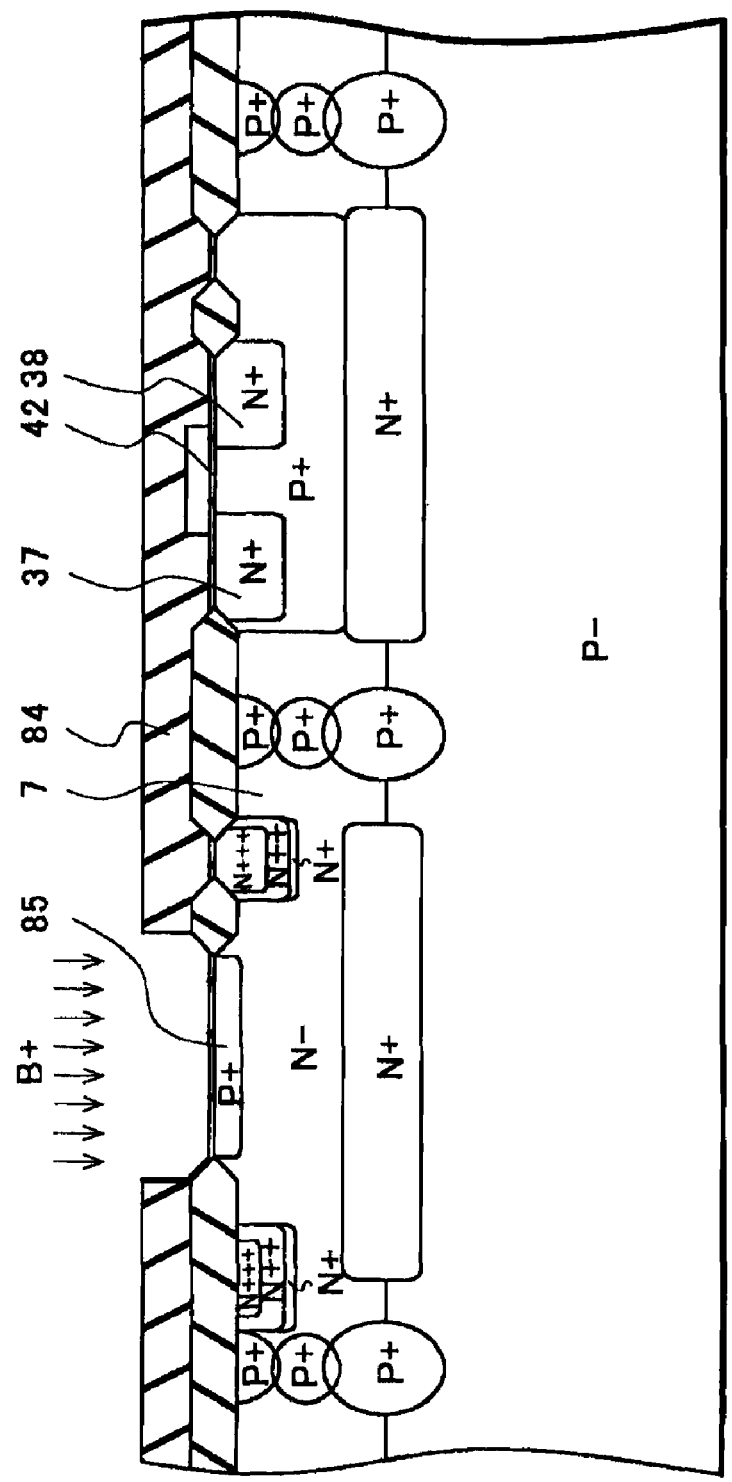
FIG. 8 is a cross-sectional view showing the method for manufacturing a semiconductor device according to the embodiment of the present invention.

Next, as shown in FIG. 8, a photoresist 84 is formed on the silicon oxide film used as the gate oxide film 42. Thereafter, by use of the heretofore known photolithography technique, an opening is formed in the photoresist 84 on a region where a P type diffusion layer 85 is to be formed. Subsequently, ions of a P type impurity, for example, boron (B) are implanted from the surface of the epitaxial layer 7 at an accelerating voltage of 70 to 90 keV and a dose of $3.0 \times 10^{12}$ to $1.0 \times 10^{14}/cm^2$. Thereafter, the photoresist 84 is removed and thermal diffusion is performed. Note that the P type diffusion layer 85 is thermally diffused by the thermal diffusion step to form a P type diffusion layer 18 (see FIG. 9).

Figure 9:
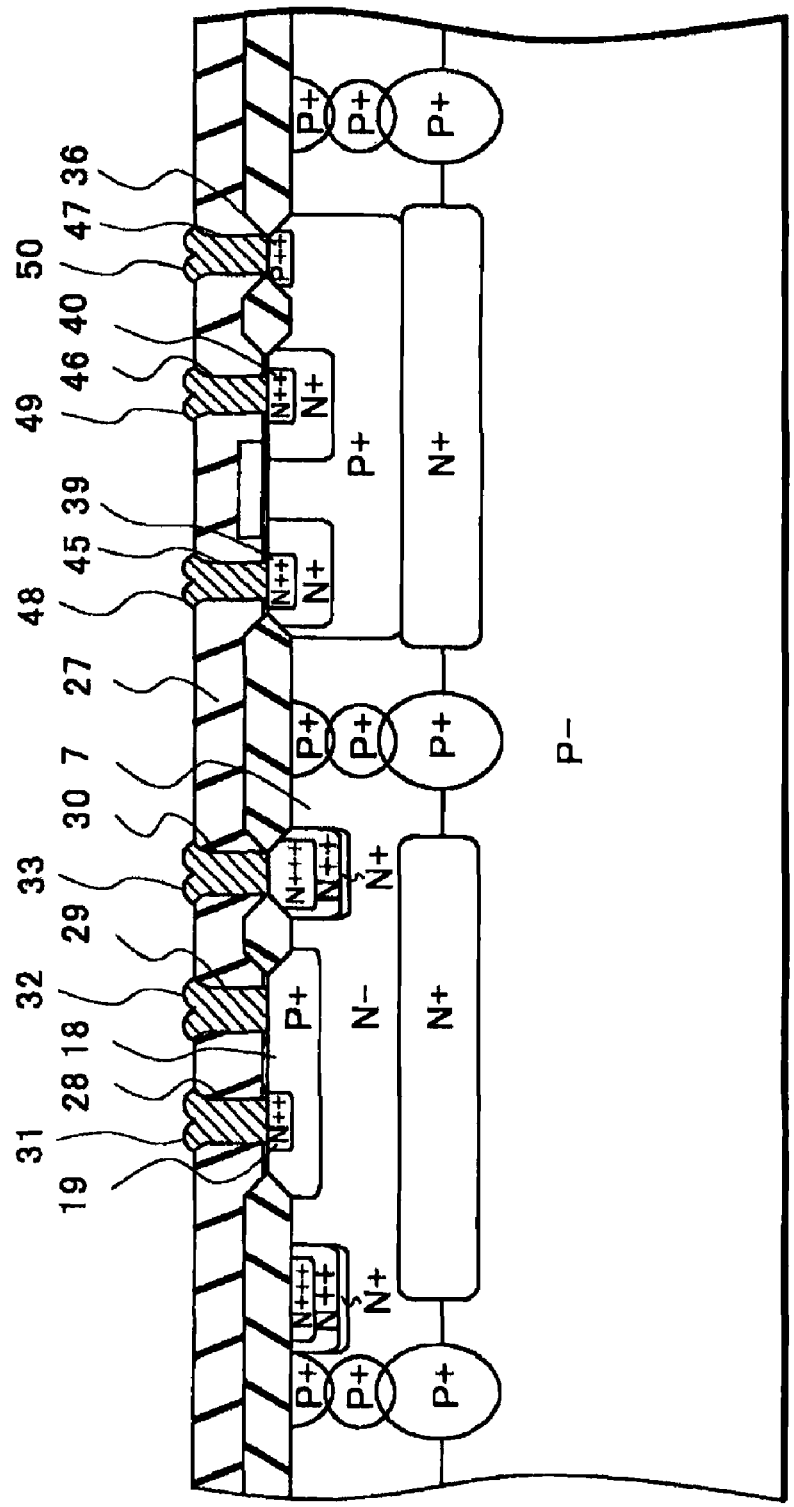
FIG. 9 is a cross-sectional view showing the method for manufacturing a semiconductor device according to the embodiment of the present invention.

Lastly, as shown in FIG. 9, after N type diffusion layers 19, 39 and 40 are formed by use of the heretofore known photolithography technique and a heretofore known ion implantation technique, a P type diffusion layer 36 is formed. Thereafter, on the epitaxial layer 7, an NSG film, a BPSG film and the like, for example, are deposited as an insulating layer 27. Subsequently, by use of the heretofore known photolithography technique, contact holes 28 to 30 and 45 to 47 are formed in the insulating layer 27 by dry etching using, for example, $CHF_3$ or $CF_4$ gas. In the contact holes 28 to 30 and 45 to 47, aluminum alloy films made of, for example, an Al—Si film, an Al—Si—Cu film, an Al—Cu film and the like are selectively formed. Thus, an emitter electrode 31, a base electrode 32, a collector electrode 33, a source electrode 48, a drain electrode 49 and a back gate electrode 50 are formed.

Note that, in this embodiment, the description was given of the case where, in formation of the diffusion layers which form the isolation regions, the two ion implantation steps are continuously performed by use of the same resist mask from above the LOCOS oxide films 24, 25, 26, 43 and 44. However, the preferred embodiment of the present invention is not limited to the above case. For example, the preferred embodiment of the present invention may also be applied to the case where three or more ion implantation steps are continuously performed by use of the same resist mask from above the LOCOS oxide films 24, 25, 26, 43 and 44 and multiple stages of P type buried diffusion layers are formed between the P type buried diffusion layers 8, 11 and 14 and the P type diffusion layers 10, 13 and 16, respectively. Besides the above, various changes can be made without departing from the scope of the present invention.

Figure 10:
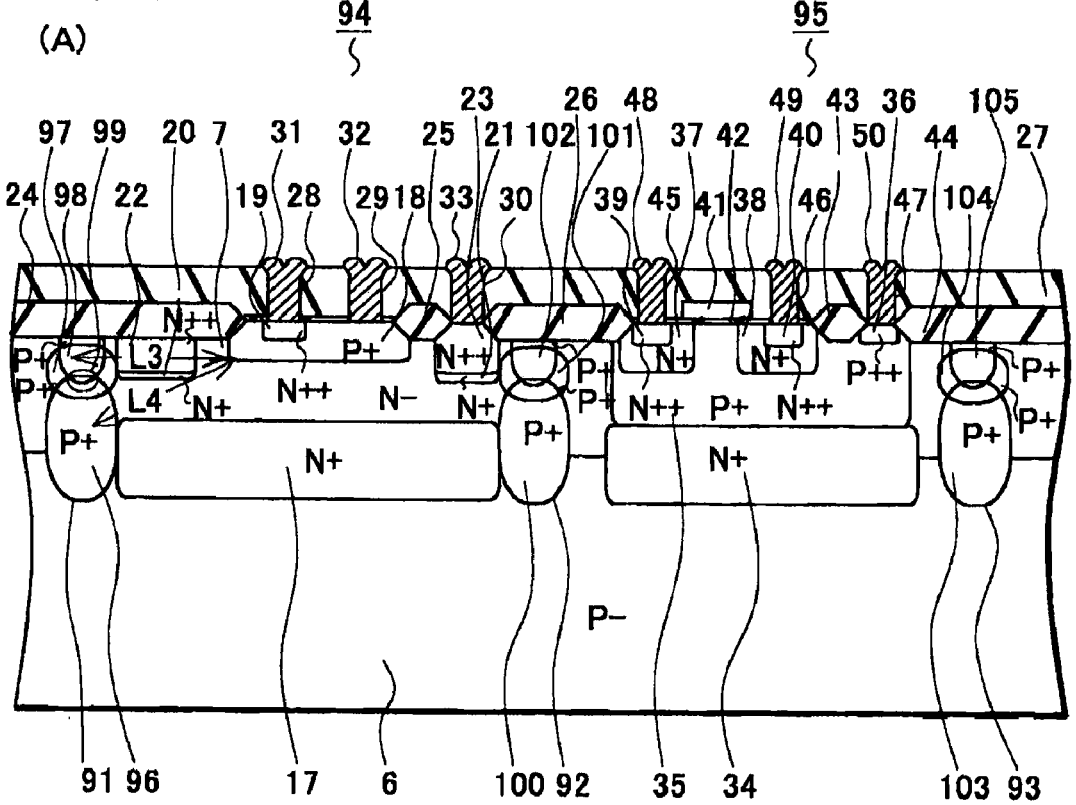
FIG. 10A is a cross-sectional view and FIG. 10B is a plan view each showing a semiconductor device according to a preferred embodiment of the present invention.
Figure 10:
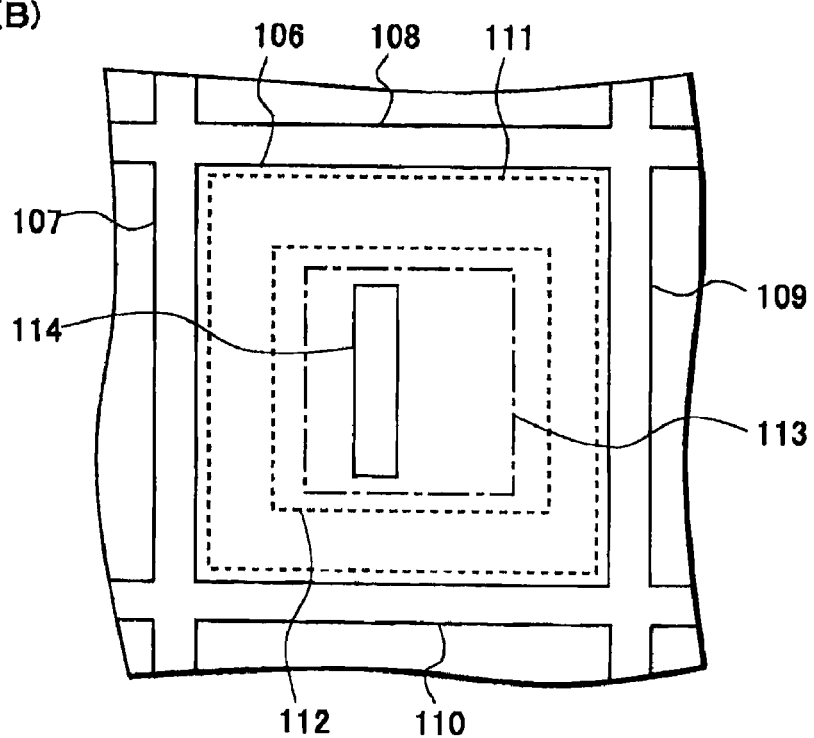
Figure 11:
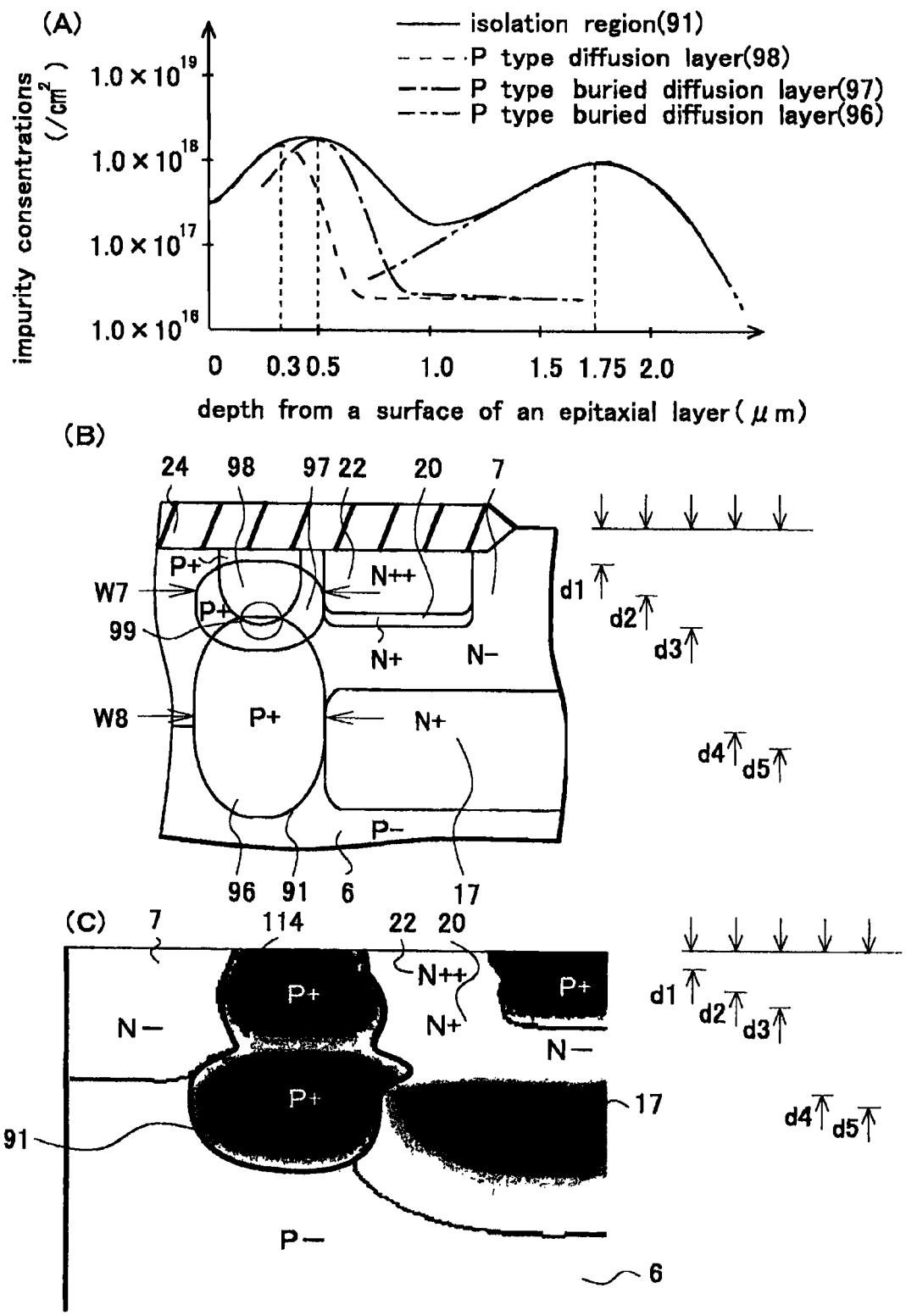
FIG. 11A is a graph showing an impurity concentration and a diffusion depth in an isolation region.
FIG. 11B is a cross-sectional view showing the isolation region and FIG. 11C is a view showing the isolation region represented by a concentration distribution, each according to the embodiment of the present invention.

Next, with reference to FIGS. 10 and 11, a semiconductor device according to a third embodiment of the present invention will be described in detail. FIG. 10A is a cross-sectional view showing the semiconductor device according to this embodiment. FIG. 10B is a plan view showing an NPN transistor shown in FIG. 10A. FIG. 11A is a graph showing an impurity concentration and a diffusion depth in a diffusion layer which forms an isolation region according to this embodiment. FIG. 11B is a cross-sectional view showing the isolation region according to this embodiment. FIG. 11C is a view showing the isolation region represented by a concentration distribution.

Note that, in this embodiment, a shape of each of isolation regions 91 to 93 is basically different from that of each of the isolation regions 1 to 3 shown in FIG. 1. Moreover, an NPN transistor 94 and an N channel MOS transistor 95, which are formed in element formation regions divided by the isolation regions 91 to 93, have substantially the same shapes as those of the NPN transistor 4 and the N channel MOS transistor 5 shown in FIG. 1. Thus, the above description of FIG. 1 will be accordingly referred to and the same constituent components are denoted by the same reference numerals.

As shown in FIG. 10A, an N type epitaxial layer 7 is formed on a P type single crystal silicon substrate 6. The epitaxial layer 7 is divided into a plurality of element formation regions by the isolation regions 91 to 93. The NPN transistor 94 is formed in one of the element formation regions, and the N channel MOS transistor 95 is formed in another region thereof.

The isolation region 91 is formed of P type buried diffusion layers 96 and 97 and a P type diffusion layer 98. As indicated by a circle 99, the P type buried diffusion layer 96 and the P type diffusion layer 98 partially overlap with each other. The P type buried diffusion layer 97 is formed in the epitaxial layer 7 so as to further overlap with the overlapping region indicated by the circle 99. Moreover, the P type buried diffusion layer 97 forms PN junction regions with N type diffusion layers 20 and 22. Note that, as in the case of the isolation region 91 described above, the isolation region 92 is formed of P type buried diffusion layers 100 and 101 and a P type diffusion layer 102, and the isolation region 93 is formed of P type buried diffusion layers 103 and 104 and a P type diffusion layer 105.

As shown in FIG. 10B, a region surrounded by solid lines 106 to 110 indicates the P type diffusion layer 98 in the isolation region 91 and the P type diffusion layer 102 in the isolation region 92. A region surrounded by dotted lines 111 and 112 indicates the N type diffusion layers 20 to 23 as a collector region of the NPN transistor 94. A region surrounded by a dashed line 113 indicates a P type diffusion layer 18 as a base region of the NPN transistor 94. A region surrounded by a solid line 114 indicates an N type diffusion layer 19 as an emitter region of the NPN transistor 94. As shown in FIGS. 10A and 10B, the N type diffusion layers 20 to 23 are circularly arranged between the isolation regions 91 and 92 and form PN junction regions with the P type buried diffusion layers 97 and 101 in the isolation regions. Note that, in the cross-section of FIG. 10A, the P type diffusion layers 98 and 102 are shown as separate diffusion layers. However, those diffusion layers are actually formed as one circular diffusion layer. Moreover, the same goes for the P type buried diffusion layers 97 and 101, the P type buried diffusion layers 96 and 100, the N type diffusion layers 20 and 21, and the N type diffusion layers 22 and 23.

In FIG. 11A, a vertical axis indicates impurity concentrations in the P type buried diffusion layers 96 and 97 and the P type diffusion layer 98, and a horizontal axis indicates diffusion depths of the P type buried diffusion layers 96 and 97 and the P type diffusion layer 98. Moreover, a solid line represents the entire isolation region 91, a dotted line represents the P type diffusion layer 98, a dashed line represents the P type buried diffusion layer 97, and a double-dashed line represents the P type buried diffusion layer 96.

As indicated by the dotted line, the P type diffusion layer 98 is formed so as to have its impurity concentration peak positioned in a region where the depth from a surface of the epitaxial layer 7 is approximately 0.3 μm. As indicated by the dashed line, the P type buried diffusion layer 97 is formed so as to have its impurity concentration peak positioned in a region where the depth from the surface of the epitaxial layer 7 is approximately 0.5 μm. As indicated by the double dashed line, the P type buried diffusion layer 96 is formed so as to have its impurity concentration peak positioned in a region where the depth from the surface of the epitaxial layer 7 is approximately 1.75 μm. Moreover, as indicated by the solid line, the isolation region 91 has a region where the impurity concentration peak fluctuates at a high concentration within a range of 0.3 to 0.5 μm from the surface of the epitaxial layer 7 due to the overlap between the P type buried diffusion layer 97 and the P type diffusion layer 98. Moreover, although the P type diffusion layer 98 and the P type buried diffusion layer 96 overlap with each other in a region where the depth from the surface of the epitaxial layer 7 is approximately 1.0 μm, the impurity concentration of $1.0 \times 10^{17}/cm^2$ or more is maintained also in this overlapping region.

This structure makes it possible to prevent depletion layers spreading from PN junction regions of the P type isolation region 91 and the P type substrate 6 with the N type epitaxial layer 7 and the N type buried diffusion layer 17 from crossing the isolation region 91 and spreading up to the adjacent other element formation region. Thus, a leak current between adjacent elements is prevented.

In FIG. 11B, d1 indicates a depth of an impurity concentration peak position of the P type diffusion layer 98, d2 indicates a depth of an impurity concentration peak position of the P type buried diffusion layer 97, d3 indicates a depth up to the overlapping region between the P type diffusion layer 98 and the P type buried diffusion layer 96, d4 indicates a thickness of the epitaxial layer, and d5 indicates a depth of an impurity concentration peak position of the P type buried diffusion layer 96. Note that, as described above with reference to FIG. 11A, d1 is approximately 0.3 μm, d2 is approximately 0.5 μm, d3 is approximately 1.0 μm, d4 is approximately 1.65 μm and d5 is approximately 1.75 μm. Moreover, although FIG. 11B shows the isolation region 91, the same goes for the isolation region 92.

As shown in FIG. 11B, the impurity concentration peaks of the P type diffusion layer 98 and the P type buried diffusion layer 97 are positioned closer to the surface of the epitaxial layer 7 than a center region (approximately 0.8 μm) of the epitaxial layer 7. As a result, the isolation region 91 is caused to have a shape in which the P type buried diffusion layer 97 and the P type diffusion layer 98 that are flattened in a horizontal direction are arranged on the P type buried diffusion layer 96. Moreover, the P type diffusion layer 98 and the P type buried diffusion layer 97 overlap with each other. Furthermore, in the region at the depth of approximately 0.3 to 0.5 μm from the surface of the epitaxial layer 7, the P type buried diffusion layer 97 forms a PN junction region with the N type diffusion layers 20 and 22. In this region with a high concentration of the P type impurity, lateral diffusion is also likely to be extended. However, an increase in a diffusion width W7 of the P type buried diffusion layer 97 is suppressed by the N type diffusion layers 20 and 22. Thus, by reducing the lateral diffusion width of the isolation region 91, a device size of the NPN transistor 94 can be reduced. Note that, as shown in FIGS. 10A and 10B, the N type diffusion layers 20 to 23 are circularly arranged between the isolation regions 91 and 92. Thus, an increase in the diffusion widths W7 of the P type buried diffusion layers 97 and 101 is also suppressed in the entire circumference.

Similarly, in the region at the depth of approximately 1.6 to 2.0 μm from the surface of the epitaxial layer 7, the P type buried diffusion layer 96 and the N type buried diffusion layer 17 form a PN junction region. Since ion implantation is performed to form the P type buried diffusion layer 96 before deposition of the epitaxial layer 7, the P type buried diffusion layer 96 is subjected to heat treatment for a long time and thus lateral diffusion thereof is also likely to be extended. However, an increase in a lateral diffusion width W8 of the P type buried diffusion layer 96 is suppressed by the N type buried diffusion layer 17. Thus, by suppressing the lateral diffusion of the isolation region 91, the device size of the NPN transistor 94 is reduced.

Furthermore, the P type buried diffusion layer 97 is formed so as to further overlap with the overlapping region indicated by the circle 99. By use of this structure, the three diffusion layers 96 to 98 allow the overlapping region indicated by the circle 99 to be designed to have a desired impurity concentration or more. Thus, an upward expansion width of the P type buried diffusion layer 96 and a downward expansion width of the P type diffusion layer 98 can be reduced. Moreover, the lateral diffusion of the isolation region 91 is suppressed by reducing the diffusion width W7 of the P type diffusion layer 98 and the diffusion width W8 of the P type buried diffusion layer 96. Thus, the device size of the NPN transistor 94 is reduced.

As shown in FIG. 11C, a heavy line 114 indicates an external shape of the isolation region 91. Note that, in FIG. 11C, a LOCOS oxide film 24 is omitted. Moreover, the darker region indicates, the higher impurity concentration.

First, description will be given of the side (left part of the page space) where the isolation region 91 forms a PN junction region with the epitaxial layer 7. The lateral diffusion width is gradually increased to the depth d3 from the surface of the epitaxial layer 7. Moreover, between the depths d3 and d4, the lateral diffusion width is gradually reduced and then increased again. Specifically, above the center region of the epitaxial layer 7, the three diffusion layers 96 to 98 overlap with each other and the lateral diffusion widths thereof are also increased.

Next, description will be given of the side (right part of the page space) where the isolation region 91 forms PN junction regions with the N type diffusion layers 20 and 22 or the N type buried diffusion layer 17. In the region between the depths d2 and d3, the three diffusion layers 96 to 98 overlap with each other and the lateral diffusion thereof is likely to be extended. However, extension of the lateral diffusion in the overlapping region is suppressed by the N type diffusion layers 20 and 22. Similarly, in the region between the depths d4 and d5, extension of the lateral diffusion is suppressed by the N type buried diffusion layer 17. As described above, the lateral diffusion width of the isolation region 91 is reduced by the N type diffusion layers 20 and 22 and the N type buried diffusion layer 17. Specifically, in the external shape of the isolation region 91 in the right part of the page space, curved surfaces undergo more changes than those in the external shape of the isolation region 91 in the left part of the page space.

Note that, also in this embodiment, a distance L3 between the P type diffusion layer 18 and the P type buried diffusion layer 97 and a distance L4 between the P type diffusion layer 18 and the P type buried diffusion layer 96, which are shown in FIG. 10A, can be shortened. By use of this structure, as in the case of the embodiment described with reference to FIG. 1, the breakdown voltage characteristics of the NPN transistor 94 are maintained and the device size thereof is reduced.

Moreover, description was given of the structure in which one epitaxial layer 7 is deposited on the substrate 6 and the isolation regions 91 to 93 are formed in the epitaxial layer 7. However, the preferred embodiment of the present invention is not limited to the above case. For example, the preferred embodiment of the present invention may also be applied to the case where two or more epitaxial layers are laminated on the substrate and the isolation regions are formed to have the above structure in the plurality of epitaxial layers. Also in this case, by arranging the isolation regions so as to have the above structure in the uppermost epitaxial layer, the impurity concentrations in the isolation regions can be controlled while suppressing lateral diffusion thereof. Besides the above, various changes can be made without departing from the scope of the present invention.

Figure 12:
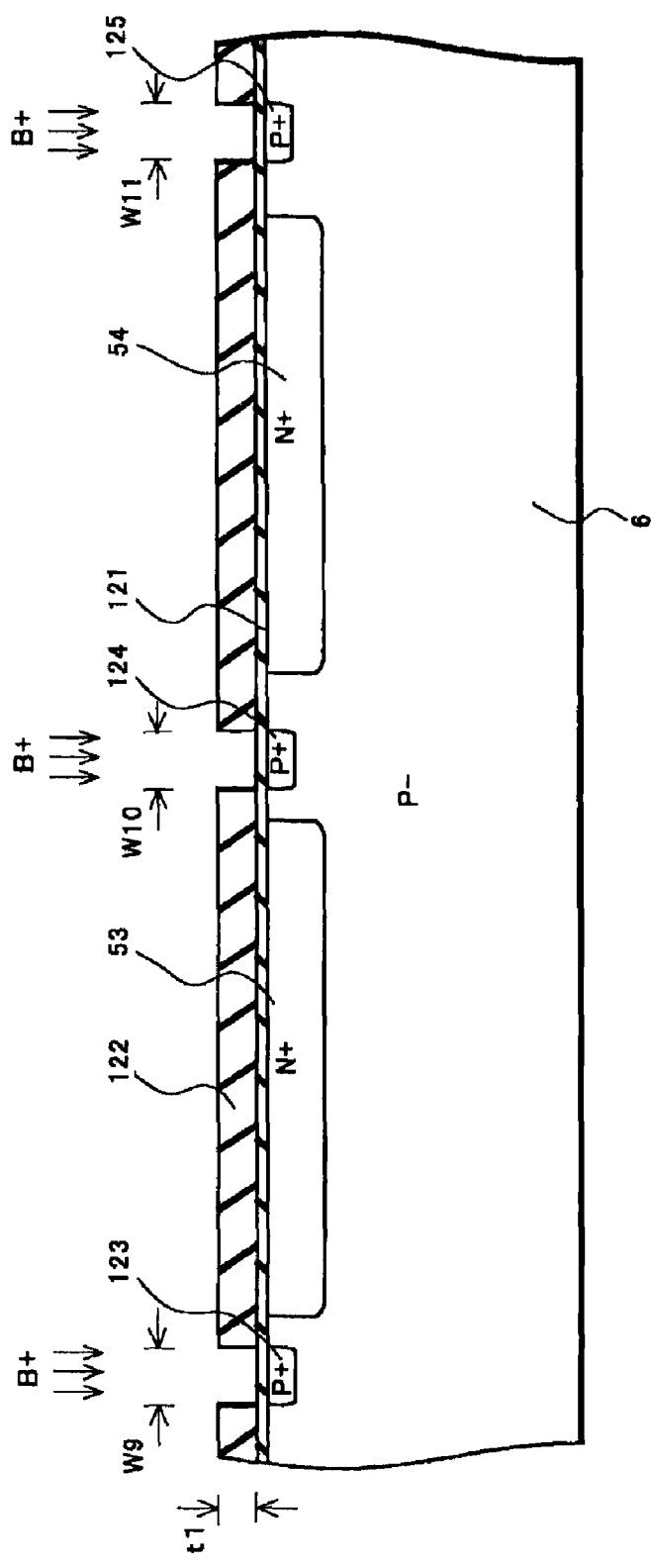
FIG. 12 is a cross-sectional view showing a method for manufacturing a semiconductor device according to a preferred embodiment of the present invention.
Figure 13:
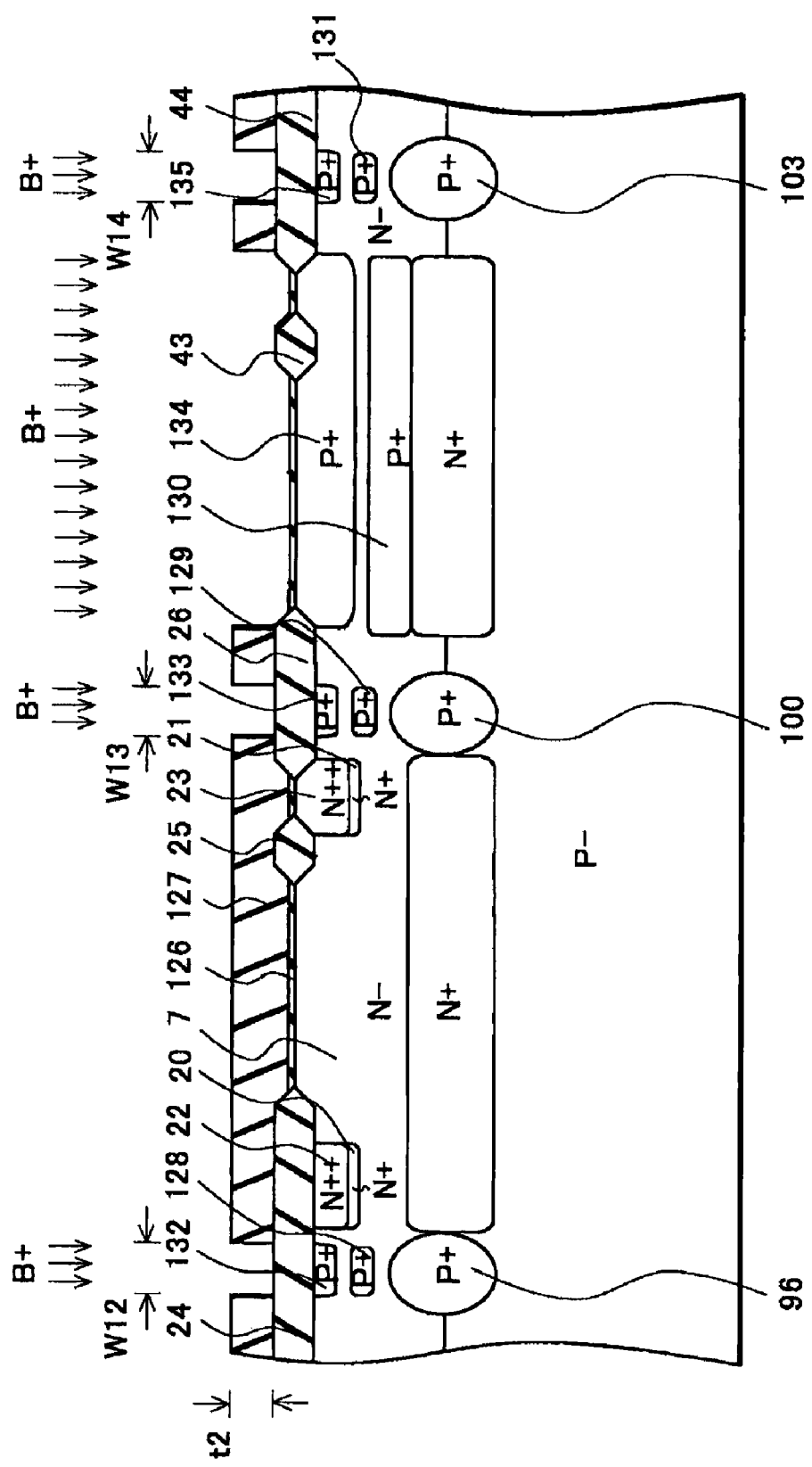
FIG. 13 is a cross-sectional view showing the method for manufacturing a semiconductor device according to the embodiment of the present invention.
Figure 14:
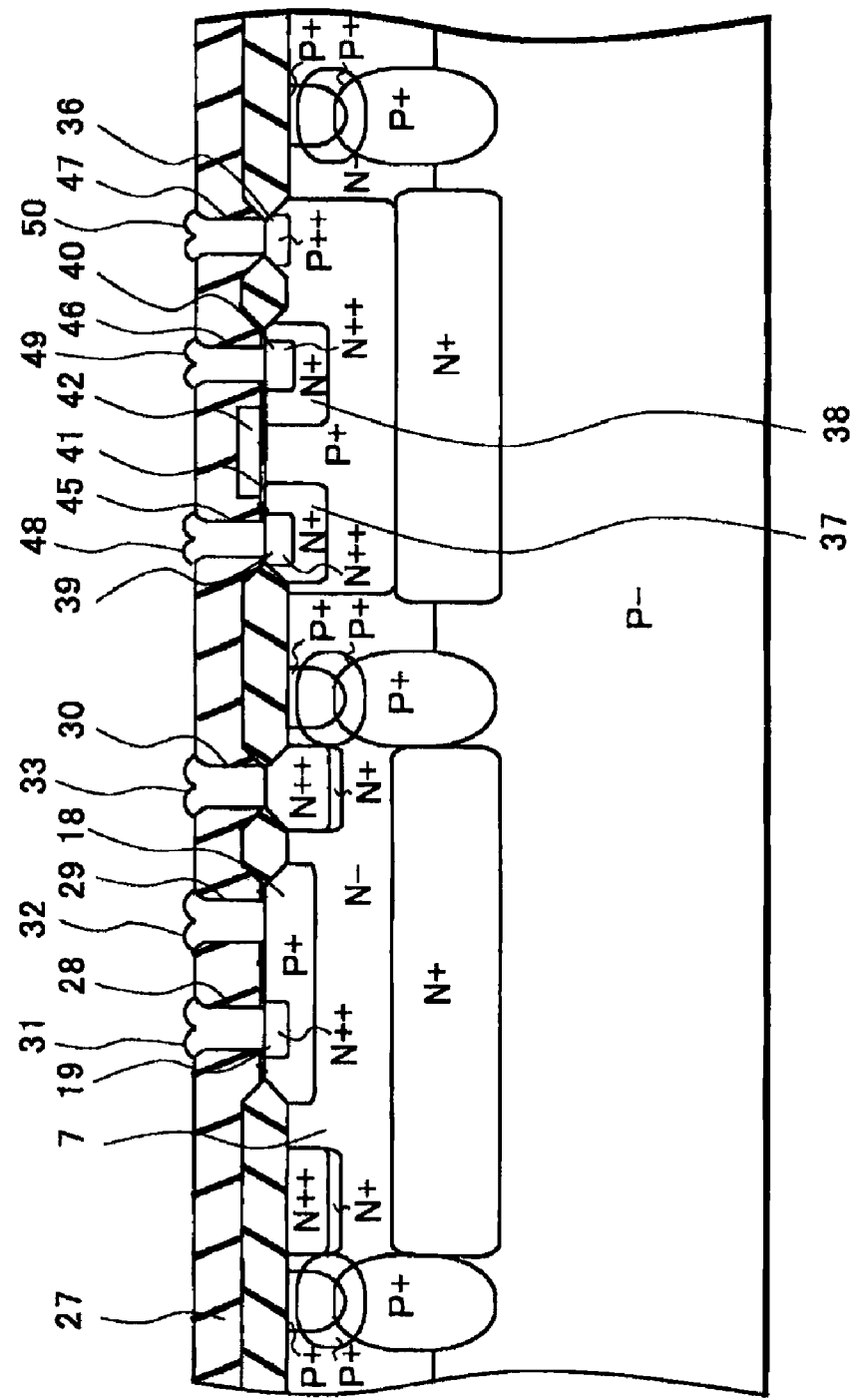
FIG. 14 is a cross-sectional view showing the method for manufacturing a semiconductor device according to the embodiment of the present invention.

Next, with reference to FIGS. 12 to 14, detailed description will be given of a method for manufacturing a semiconductor device according to a fourth embodiment of the present invention. FIGS. 12 to 14 are cross-sectional views showing the method for manufacturing a semiconductor device according to this embodiment. As described above, the NPN transistor 94 and the N channel MOS transistor 95 have substantially the same shapes as those of the NPN transistor 4 and the N channel MOS transistor 5 shown in FIG. 1, respectively. Thus, the above description of FIGS. 2, 4, 5 and 7 to 9 will be accordingly referred to and the same constituent components are denoted by the same reference numerals.

First, as shown in FIG. 2, a P type single crystal silicon substrate 6 is provided and N type buried diffusion layers 53 and 54 are formed in the substrate 6. Note that the description of FIG. 2 will be referred to for details about the manufacturing method.

Next, as shown in FIG. 12, a silicon oxide film 121 is formed on the substrate 6 and a photoresist 122 is formed on the silicon oxide film 121. Thereafter, by use of a heretofore known photolithography technique, openings are formed in the photoresist 122 on regions where P type buried diffusion layers 123 to 125 are to be formed. Subsequently, ions of a P type impurity, for example, boron (B+) are implanted from the surface of the substrate 6 at an accelerating voltage of 80 keV and a dose of $3.0 \times 10^{13}/cm^2$.

In this event, a thickness t1 of the photoresist 122 is, for example, 1.8 μm and line widths W9 to W11 on respective formation regions of the P type buried diffusion layers 123 to 125 are, for example, 1.2 μm. This is because the following problem occurs when the thickness of the photoresist is increased and the openings for ion implantation are formed. When the photoresist has a large thickness in formation of openings in the photoresist, etching time is extended. Thus, side faces of the photoresist in the openings are likely to droop. Specifically, the closer to an upper end of the photoresist, the longer the etching time. Moreover, the closer to an upper end of the opening, the larger the opening area. As a result, a thickness of the drooping region of the photoresist is set smaller than that of the other region. If ions of an impurity are implanted at an accelerating voltage according to the thick portion of the photoresist, the impurity passes through the photoresist in the drooping region of the photoresist. Moreover, the impurity is implanted into regions wider than the designed line width and thermally diffused. Thus, it becomes difficult to perform minute processing.

Therefore, as described above, by reducing the thickness t1 of the photoresist 122, the etching time is shortened and drooping in the openings is prevented. Moreover, minute processing for wiring widths W9 to W11 in the photoresist 122 is made possible. Furthermore, the accelerating voltage in ion implantation is lowered in accordance with reduction in the thickness t1 of the photoresist 122. As a result, the impurity concentration peaks of the P type buried diffusion layers 123 to 125 are set closer to the surface of the substrate 6. Thus, it becomes easier for the P type buried diffusion layers 123 to 125 to expand upward to the epitaxial layer 7. Accordingly, heat treatment time for diffusing the P type buried diffusion layers 123 to 125 can be shortened. Thus, the lateral diffusion widths thereof can be reduced.

Next, as shown in FIGS. 4 and 5, an N type epitaxial layer 7 is formed on the substrate 6. After N type diffusion layers 20 to 23 are formed in the epitaxial layer 7, LOCOS oxide films 24 to 26, 43 and 44 are formed. Also in this embodiment, dedicated thermal diffusion steps for thermally diffusing the P type buried diffusion layers 123 to 125 are not performed. Note that the description of FIGS. 4 and 5 will be referred to for details about the manufacturing method.

Next, as shown in FIG. 13, a silicon oxide film 126 is formed on an upper surface of the epitaxial layer 7 and a photoresist 127 is formed on the silicon oxide film 126. Thereafter, by use of the heretofore known photolithography technique, openings are formed in the photoresist 127 on regions where P type buried diffusion layers 128 to 131 are to be formed. Subsequently, ions of a P type impurity, for example, boron (B++) are implanted from the surface of the epitaxial layer 7 at an accelerating voltage of 300 keV and a dose of $2.5 \times 10^{13}/cm^2$.

In this event, a thickness t2 of the photoresist 127 is, for example, 1.8 μm and line widths W12 to W14 on respective formation regions of the P type buried diffusion layers 128, 129 and 131 are, for example, 1.2 μm. As described above, reduction in the thickness t2 of the photoresist 127 enables minute processing of the line widths W12 to W14. Furthermore, by lowering the accelerating voltage in the implantation of ions of an impurity, impurity concentration peaks of the P type buried diffusion layers 128, 129 and 131 are set closer to the surface of the epitaxial layer 7.

Next, second ion implantation is performed by use of the same photoresist 127 without thermally diffusing the P type buried diffusion layers 128 to 131. Specifically, ions of a P type impurity, for example, boron (B+) are implanted from above the photoresist 127 at an accelerating voltage of 190 keV and a dose of $8.0 \times 10^{12}/cm^2$. By this second ion implantation step, P type diffusion layers 132 to 135 are formed. Thereafter, the photoresist 127 is removed. Note that, although not shown in FIG. 13, ions of an N type impurity, for example, phosphorus (P+) are implanted into formation regions of N type diffusion layers 22 and 23 and, thereafter, the P type buried diffusion layers 128 to 131 and the P type diffusion layers 132 to 135 are thermally diffused in the same step as the implantation of ions of an N type impurity. Thus, in this embodiment, dedicated thermal diffusion steps for thermally diffusing the P type buried diffusion layers 128 to 131 and the P type diffusion layers 132 to 135 are omitted.

By lowering the accelerating voltage in the implantation of ions of an impurity in accordance with reduction in the thickness t2 of the photoresist 127, impurity concentration peaks of the P type diffusion layers 132, 133 and 135 are set closer to the surface of the epitaxial layer 7. By use of this manufacturing method, despite the implantation of boron ions (B++, B+) having a relatively large molecular size, regions of the epitaxial layer 7 damaged by the boron are reduced. Note that, after all the ion implantation steps are finished, annealing is performed in a nitrogen atmosphere for restoring the damage.

Next, as shown in FIGS. 7 to 9, a gate oxide film 42 and a gate electrode 41 are formed on the epitaxial layer 7. Thereafter, N type diffusion layers 19 and 37 to 40 and P type diffusion layers 18 and 36 are formed. Note that the description of FIGS. 7 to 9 will be referred to for details about the manufacturing method.

Lastly, as shown in FIG. 14, on the epitaxial layer 7, an NSG film, a BPSG film and the like, for example, are deposited as an insulating layer 27. Subsequently, by use of the heretofore known photolithography technique, contact holes 28 to 30 and 45 to 47 are formed in the insulating layer 27 by dry etching using, for example, $CHF_3$ or $CF_4$ gas. In the contact holes 28 to 30 and 45 to 47, aluminum alloy films made of, for example, an Al—Si film, an Al—Si—Cu film, an Al—Cu film and the like are selectively formed. Thus, an emitter electrode 31, a base electrode 32, a collector electrode 33, a source electrode 48, a drain electrode 49 and a back gate electrode 50 are formed.

Note that, in this embodiment, the description was given of the case where, in formation of the isolation regions, the P type buried diffusion layers 97, 101 and 104 and the P type diffusion layers 98, 102 and 105 are formed from the surface of the epitaxial layer 7. However, the preferred embodiment of the present invention is not limited to the above case. The preferred embodiment of the present invention may also be applied to the case where the photoresist 127 (see FIG. 13) is further used as the same mask and boron ions (B+), for example, are implanted at an accelerating voltage of 40 keV and a dose of $4.0\times10^{12}/cm^2$. In this case, the impurity concentrations in the formation regions of the P type diffusion layers 98, 102 and 105 are further increased. Besides the above, various changes can be made without departing from the scope of the present invention.

In the present invention, the plurality of diffusion layers, which form the isolation region, are formed in the depth direction and the upward and downward expansion widths of the individual diffusion layers are reduced. This structure causes the formation region of the isolation region to be reduced in size.

Moreover, in the present invention, the N type diffusion layer is formed between the base region of the NPN transistor and the isolation region. This structure makes short-circuiting less likely to occur between the base region and the isolation region. Thus, the breakdown voltage characteristics of the NPN transistor are improved.

Moreover, in the present invention, the N type diffusion layers disposed between the base region of the NPN transistor and the isolation region have a double diffusion structure. This structure makes short-circuiting less likely to occur between the base region and the isolation region.

Moreover, in the present invention, the ion implantation steps for the buried diffusion layers and the diffusion layers, all of which form the isolation region, are continuously performed from the surface of the epitaxial layer. This manufacturing method makes it possible to omit dedicated thermal diffusion steps for diffusing the buried diffusion layers and also to prevent expansion of the formation region of the isolation region.

Moreover, in the present invention, the ion implantation steps for the buried diffusion layers and the diffusion layers, all of which form the isolation region, are continuously performed from the surface of the epitaxial layer. This manufacturing method makes it possible to reduce the number of masks and manufacturing cost.

Moreover, in the present invention, the diffusion layers, which form the isolation region, are formed after the LOCOS oxide films are formed. This manufacturing method makes it possible to reduce crystal defects caused in the surfaces of the formation regions of the diffusion layers, which form the isolation region, and in regions adjacent thereto.

Moreover, in the present invention, the diffusion layers which form the isolation region and the diffusion layers which form the back gate region of the MOS transistor are formed in the shared step. This manufacturing method makes it possible to suppress expansion of the formation regions of the isolation region by omitting the thermal diffusion steps.

What is claimed is:

1. A method for manufacturing a semiconductor device, comprising:
    preparing a one-conductivity-type semiconductor substrate;
    forming an opposite-conductivity-type epitaxial layer on the semiconductor substrate after implanting ions of an impurity for forming a first one-conductivity-type buried diffusion layer into the semiconductor substrate; and
    forming an isolation region by firstly implanting ions of an impurity for forming a second one-conductivity-type buried diffusion layer from a surface of the epitaxial layer, then continuously implanting ions of an impurity for forming a one-conductivity-type diffusion layer, and finally performing thermal diffusion, so as to connect the first one-conductivity-type buried diffusion layer, the second one-conductivity-type buried diffusion layer and the one-conductivity-type diffusion layer with one another,
    wherein, after a LOCOS oxide film is formed in the epitaxial layer, ions of the impurity for forming the second one-conductivity-type buried diffusion layer and ions of the impurity for forming the one-conductivity-type diffusion layer are implanted from above the LOCOS oxide film.

2. The method of claim 1 wherein the second one-conductivity-type buried diffusion layer and the one-conductivity type diffusion layer are formed in the same thermal diffusion step so as to connect the first one-conductivity-type buried diffusion layer, the second one-conductivity-type buried diffusion layer and the one-conductivity-type diffusion layer with one another.

3. A method for manufacturing a semiconductor device, comprising the steps of:
    preparing a one-conductivity-type semiconductor substrate;
    forming an opposite-conductivity-type epitaxial layer on the semiconductor substrate after implanting ions of an impurity for forming a first one-conductivity-type buried diffusion layer into the semiconductor substrate; and
    forming an isolation region by firstly implanting ions of an impurity for forming a second one-conductivity-type buried diffusion layer from a surface of the epitaxial layer, then continuously implanting ions of an impurity for forming a one-conductivity-type diffusion layer, and finally performing thermal diffusion, so as to connect the first one-conductivity-type buried diffusion layer, the second one-conductivity-type buried diffusion layer and the one-conductivity-type diffusion layer with one another, wherein, in the step of implanting ions of the impurity for forming the second one-conductivity-type buried diffusion layer and ions of the impurity for forming the one-conductivity-type diffusion layer, the ion implantation is performed so as to allow impurity concentration peaks of the second one-conductivity type buried diffusion layer and the one-conductivity-type diffusion layer to be positioned closer to the surface of the epitaxial layer than a center of the epitaxial layer.

4. The method for manufacturing a semiconductor device, according to claim 3, wherein ions of the impurity for forming the second one-conductivity-type buried diffusion layer and ions of the impurity for forming the one-conductivity-type diffusion layer are implanted by use of a same resist mask.

5. A method for manufacturing a semiconductor device, comprising the steps of:

preparing a one-conductivity-type semiconductor substrate;

forming an opposite-conductivity-type epitaxial layer on the semiconductor substrate after implanting ions of an impurity for forming a first one-conductivity-type buried diffusion layer into the semiconductor substrate; and forming an isolation region by firstly implanting ions of an impurity for forming a second one-conductivity-type buried diffusion layer from a surface of the epitaxial layer, then continuously implanting ions of an impurity for forming a one-conductivity-type diffusion layer, and finally performing thermal diffusion, so as to connect the first one-conductivity-type buried diffusion layer, the second one-conductivity-type buried diffusion layer and the one-conductivity-type diffusion layer with one another, wherein, after a LOCOS oxide film is formed in the epitaxial layer, ions of the impurity for forming the second one-conductivity-type buried diffusion layer and ions of the impurity for forming the one-conductivity-type diffusion layer are implanted from above the LOCOS oxide film by use of a same resist mask.

\* \* \* \* \*